(12) United States Patent
Kato

(10) Patent No.: US 11,143,695 B2
(45) Date of Patent: Oct. 12, 2021

(54) INSPECTION DEVICE AND INSPECTION METHOD FOR INSPECTING CONNECTED PARTS OF A PLURALITY OF PINS TO A WIRING BOARD TO DETECT A SHORT CIRCUIT FAILURE

(71) Applicant: DENSO CORPORATION, Kariya (JP)

(72) Inventor: Hisashi Kato, Miyoshi (JP)

(73) Assignee: DENSO CORPORATION, Kariya (JP)

( * ) Notice: Subject to any disclaimer, the term of this patent is extended or adjusted under 35 U.S.C. 154(b) by 137 days.

(21) Appl. No.: 16/511,194

(22) Filed: Jul. 15, 2019

(65) Prior Publication Data

US 2020/0025819 A1    Jan. 23, 2020

(30) Foreign Application Priority Data

Jul. 17, 2018  (JP) .............................. JP2018-133895

(51) Int. Cl.
*G01R 31/28* (2006.01)
*G01R 1/067* (2006.01)

(52) U.S. Cl.
CPC ...... *G01R 31/2812* (2013.01); *G01R 1/06711* (2013.01); *G01R 31/2806* (2013.01)

(58) Field of Classification Search
CPC ............ G01R 1/06711; G01R 31/2806; G01R 31/2812; G01R 31/52; G01R 31/66; G01R 31/68; G01R 31/71; G01R 31/54; G01R 31/50; G05B 2219/45029; G05B 2219/42323; H05K 3/00
See application file for complete search history.

(56) References Cited

U.S. PATENT DOCUMENTS

| 4,988,202 | A | * | 1/1991 | Nayar | ............... | G01N 21/95684 |
|   |   |   |   |   |   | 250/559.34 |
| 5,148,375 | A |   | 9/1992 | Horikami |   |   |
| 5,293,324 | A | * | 3/1994 | Tokura | ............. | G01N 21/95684 |
|   |   |   |   |   |   | 382/141 |
| 5,598,345 | A | * | 1/1997 | Tokura | ................... | G01R 31/71 |
|   |   |   |   |   |   | 382/150 |
| 5,966,020 | A | * | 10/1999 | Rampone | ................ | G01R 31/71 |
|   |   |   |   |   |   | 324/756.05 |
| 5,991,435 | A | * | 11/1999 | Tsujikawa | ............. | G06T 7/0006 |
|   |   |   |   |   |   | 348/126 |

(Continued)

FOREIGN PATENT DOCUMENTS

| CN | 205941771 U | 2/2017 |
| JP | 3-160347 A | 7/1991 |
| JP | 9-21841 A | 1/1997 |

*Primary Examiner* — Vinh P Nguyen
(74) *Attorney, Agent, or Firm* — Sughrue Mion, PLLC

(57) ABSTRACT

An inspection device is provided, which is capable of detecting a short circuit failure even when a connector is provided on a wiring board. The inspection device is configured to inspect a short circuit failure generated at any connected part of a plurality of pins 153 to a wiring board via solder. The plurality of pins 153 is included in a connector provided on the wiring board. The inspection device includes: a wiring 11 connected to certain pins 153 of the plurality of pins 153; a second wiring 12 connected to remaining pins 153 of the plurality of pins 153; and a tester unit connected to the first wiring 11 and to the second wiring 12 so as to inspect insulation between the certain pins 153 and the remaining pins 153.

8 Claims, 16 Drawing Sheets

(56) References Cited

U.S. PATENT DOCUMENTS

| | | | | |
|---|---|---|---|---|
| 6,249,598 B1* | 6/2001 | Honda | ............... | G01R 31/71 |
| | | | | 382/150 |
| 6,956,387 B2* | 10/2005 | Ho | ............... | G01R 31/2896 |
| | | | | 324/756.05 |
| 8,669,777 B2* | 3/2014 | Kuah | ............... | H05K 1/0206 |
| | | | | 324/763.01 |

* cited by examiner

INSPECTION DEVICE AND INSPECTION METHOD FOR INSPECTING CONNECTED PARTS OF A PLURALITY OF PINS TO A WIRING BOARD TO DETECT A SHORT CIRCUIT FAILURE

CROSS-REFERENCE TO RELATED APPLICATIONS

The present application claims priority under 35 U.S.C. § 119(a) to Japanese Patent Application No. 2018-133895, filed on Jul. 7, 2018. The contents of this application are incorporated herein by reference in its entirety.

TECHNICAL FIELD

The present invention relates to an inspection device and an inspection method.

BACKGROUND ART

Conventionally, a wiring board that is provided with a connector is known. The connector includes a housing attached to the wiring board and a plurality of pins housed in the housing. The pins are inserted into through holes formed in the wiring board and fixed to the wiring board by soldering. That is, the respective spaces between the through holes of the wiring board and the pins are filled with solder, and thus the pins are electrically connected to a wiring pattern of the wiring board via the solder. In the case in which the pins are connected using the solder as described above, if a solder bridge is formed, it may generate a short circuit failure.

An inspection device is known, which is configured to inspect an appearance of a soldered part on the wiring board (see, for example, Patent Document 1). The inspection device disclosed in Patent Document 1 is configured to take an image of the soldered part and to perform the inspection based on the taken image.

PRIOR ART DOCUMENT

Patent Document

[Patent Document 1] JP H03-160347 A

SUMMARY OF THE INVENTION

Problem to be Solved by the Invention

However, when a wiring board is provided with a connector in the above-described inspection device, a housing of the connector may interrupt the part connected via the solder. In this case, the conventional inspection device cannot inspect the appearance, which may lead to oversight, for example, of a short circuit failure.

The present invention was made in consideration of the above circumstances, an object of which is to provide an inspection device and an inspection method capable of detecting the short circuit failure when the wiring board is provided with a connector.

Means for Solving the Problem

An inspection device of the present invention is configured to inspect a short circuit failure generated at any connected part of a plurality of pins to a wiring board via solder. The plurality of pins is included in a connector provided on the wiring board. The inspection device includes: a first wiring connected to certain pins of the plurality of pins; a second wiring connected to remaining pins of the plurality of pins; and an inspection unit connected to the first wiring and to the second wiring so as to inspect insulation between the certain pins and the remaining pins.

With the above-described configuration, when a solder bridge is formed at any part between the certain pins and the remaining pins, the inspection unit can confirm conduction caused by the solder bridge. Thus, it is possible to detect the short circuit failure. When no solder bridge is formed at any part between the certain pins and the remaining pins, the inspection unit can confirm insulation between the certain pins and the remaining pins.

In the above-described inspection device, the plurality of pins may be arranged in a matrix in plan view. The first wiring may be connected to pins in the odd-numbered columns out of the plurality of pins while the second wiring may be connected to pins in the even-numbered columns out of the plurality of pins. The inspection unit may be configured to inspect insulation between the pins in the odd-numbered columns and the pins in the even-numbered columns.

With the above-described configuration, it is possible to confirm whether the solder bridge is formed between the adjacent pins in the row direction.

In the above-described inspection device, the plurality of pins may be arranged in a matrix in plan view. The first wiring may be connected to pins in the odd-numbered rows out of the plurality of pins while the second wiring may be connected to pins in the even-numbered rows out of the plurality of pins. The inspection unit may be configured to inspect insulation between the pins in the odd-numbered rows and the pins in the even-numbered rows.

With the above-described configuration, it is possible to confirm whether the solder bridge is formed between the adjacent pins in the column direction.

The above-described inspection device may further include: upper terminals arranged so as to respectively correspond to the plurality of pins and to respectively come into contact with upper ends of the plurality of pins; and lower terminals arranged so as to respectively correspond to the plurality of pins and to respectively come into contact with lower ends of the plurality of pins. The first wiring may include: first wiring parts connecting the upper terminals that respectively correspond to the certain pins; and second wiring parts connecting the lower terminals that respectively correspond to the certain pins. The certain pins that are connected to the first wiring may be arranged in series. The second wiring may include: third wiring parts connecting the upper terminals that respectively correspond to the remaining pins; and fourth wiring parts connecting the lower terminals that respectively correspond to the remaining pins. The remaining pins that are connected to the second wiring may be arranged in series. A first end part of the first wiring and a first end part of the second wiring may be connected to the inspection unit while a second end part of the first wiring and a second end part of the second wiring may be connected to a switch.

With the above-described configuration, it is possible to confirm whether the upper terminals and the lower terminals appropriately come into contact with the pins by confirming the conduction when the switch is turned on.

An inspection method of the present invention is a method for inspecting a short circuit failure generated at any connected part of a plurality of pins to a wiring board via solder.

The plurality of pins is included in a connector provided on the wiring board. The inspection method includes the steps of: connecting a first wiring to certain pins of the plurality of pins and furthermore connecting a second wiring to remaining pins of the plurality of pins; and connecting an inspection unit to the first wiring and to the second wiring so as to cause the inspection unit to inspect insulation between the certain pins and the remaining pins.

With the above-described configuration, when a solder bridge is formed at any part between the certain pins and the remaining pins, the inspection unit can confirm conduction caused by the solder bridge. Thus, it is possible to detect the short circuit failure. When no solder bridge is formed at any part between the certain pins and the remaining pins, the inspection unit can confirm insulation between the certain pins and the remaining pins.

In the above-described inspection method, the plurality of pins may be arranged in a matrix in plan view. The step of connecting the first wiring to the certain pins and furthermore connecting the second wiring to the remaining pins may further include the steps of: connecting the first wiring to pins in the odd-numbered columns out of the plurality of pins; and connecting the second wiring to pins in the even-numbered columns out of the plurality of pins. The step of inspecting insulation may further include the step of inspecting insulation between the pins in the odd-numbered columns and the pins in the even-numbered columns.

With the above-described configuration, it is possible to confirm whether the solder bridge is formed between the adjacent pins in the row direction.

In the above-described inspection method, the plurality of pins may be arranged in a matrix in plan view. The step of connecting the first wiring to the certain pins and furthermore connecting the second wiring to the remaining pins may further include the steps of: connecting the first wiring to pins in the odd-numbered rows out of the plurality of pins; and connecting the second wiring to pins in the even-numbered rows out of the plurality of pins. The step of inspecting insulation may further include the step of inspecting insulation between the pins in the odd-numbered rows and the pins in the even-numbered rows.

With the above-described configuration, it is possible to confirm whether the solder bridge is formed between the adjacent pins in the column direction.

In the above-described inspection method, in the step of connecting the first wiring to the certain pins and furthermore connecting the second wiring to the remaining pins, the certain pins connected to the first wiring may be arranged in series while the remaining pins connected to the second wiring may be arranged in series. The step of inspecting insulation may further include the steps of: connecting the inspection unit to a first end part of the first wiring and to a first end part of the second wiring and furthermore connecting a switch to a second end part of the first wiring and to a second end part of the second wiring; turning the switch on and confirming conduction by the inspection unit; and after confirming the conduction, turning the switch off and inspecting insulation, by the inspection unit, between the certain pins and the remaining pins.

With the above-described configuration, it is possible to inspect whether the solder bridge is formed after confirming the connection of the first wiring and the second wiring to the pins.

Advantageous Effect of the Invention

With the inspection device and the inspection method of the present invention, when the wiring board is provided with the connector, it is possible to detect a short circuit failure.

DESCRIPTION OF EMBODIMENTS

Hereinafter, embodiments of the present invention will be described with reference to the drawings.

First Embodiment

Here, a configuration of an inspection device 100 according to the first embodiment of the present invention is described with reference to FIGS. 1 to 8.

Figure 1:
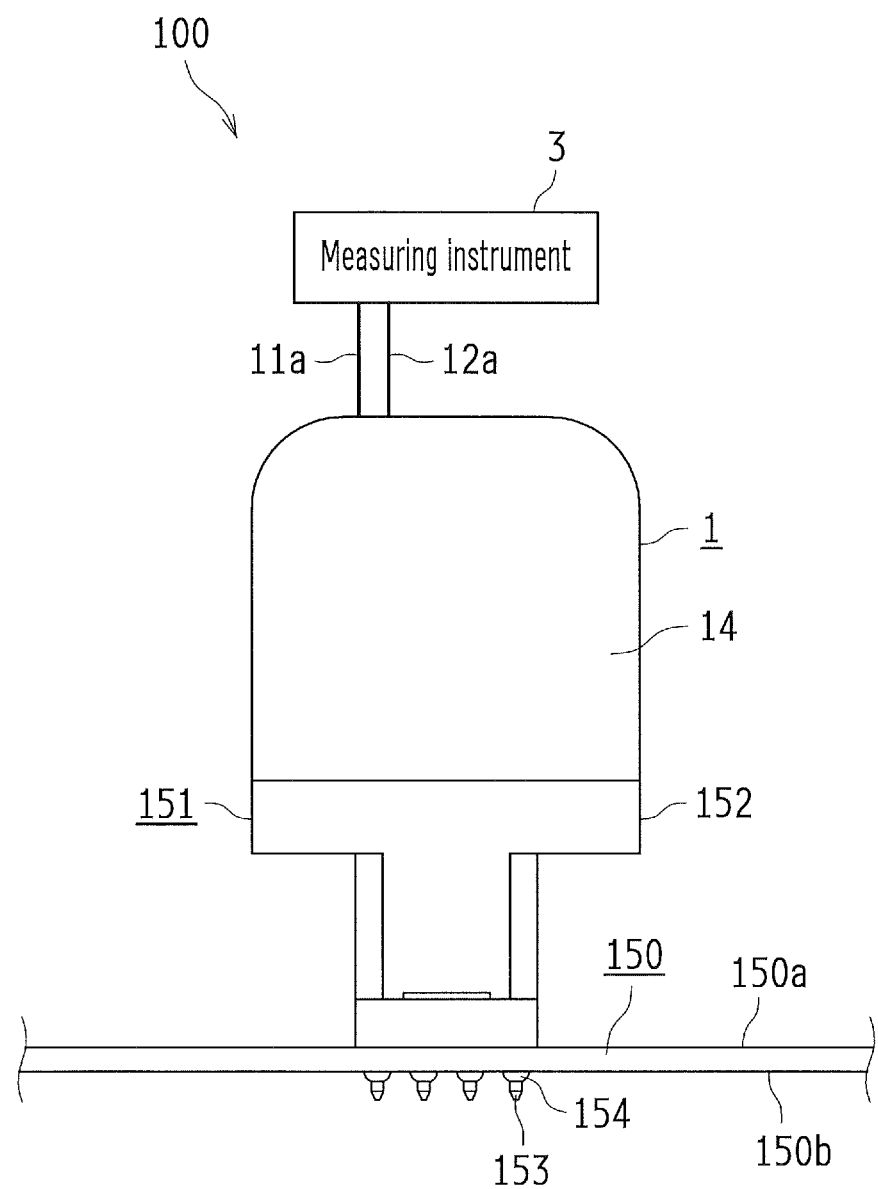
FIG. 1 is a schematic diagram indicating an inspection device according to a first embodiment, which illustrates a state in which a connector for row wise inspection of the inspection device is engaged with a connector of a wiring board.
Figure 2:
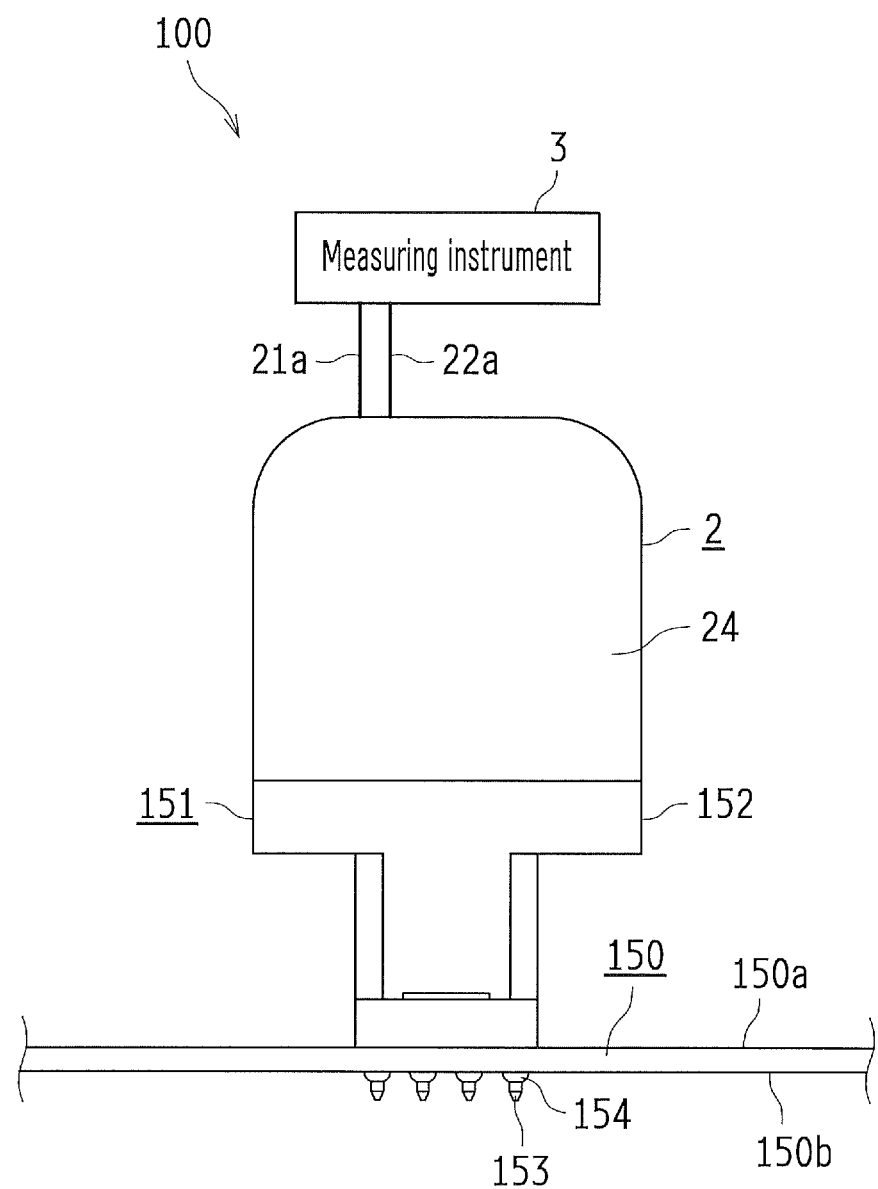
FIG. 2 is a schematic diagram indicating the inspection device according to the first embodiment, which illustrates a state in which a connector for column wise inspection of the inspection device is engaged with the connector of the wiring board.
Figure 3:
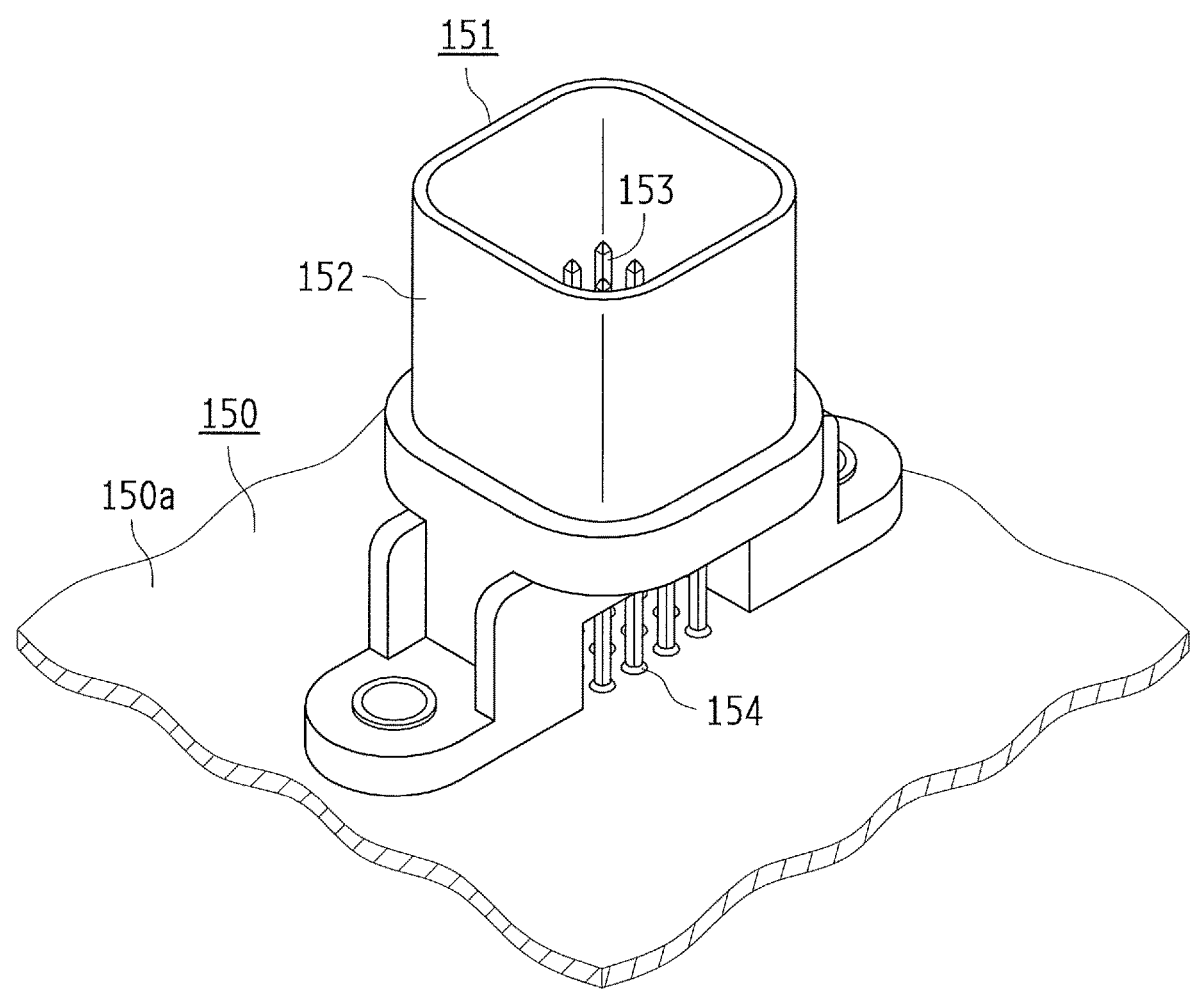
FIG. 3 is a perspective view illustrating an example of the connector of the wiring board.

As shown in FIGS. 1 and 2, the inspection device 100 is configured to inspect a short circuit failure of a connected part of a wiring board 150 using a solder 154. The wiring board 150 as an inspection object to the inspection device 100 is provided with a connector 151 as shown in FIG. 3. The connector 151 includes a housing 152 and a plurality of pins (connector pins) 153 that is housed in the housing 152.

The housing 152, which has insulation properties, is attached to a front surface 150a of the wiring board 150. The housing 152 has a cylinder-like insert port with which another connector (not shown) can be engaged. When the other connector is engaged with the housing 152, terminals of the other connector come into contact with the pins 153.

Figure 4:
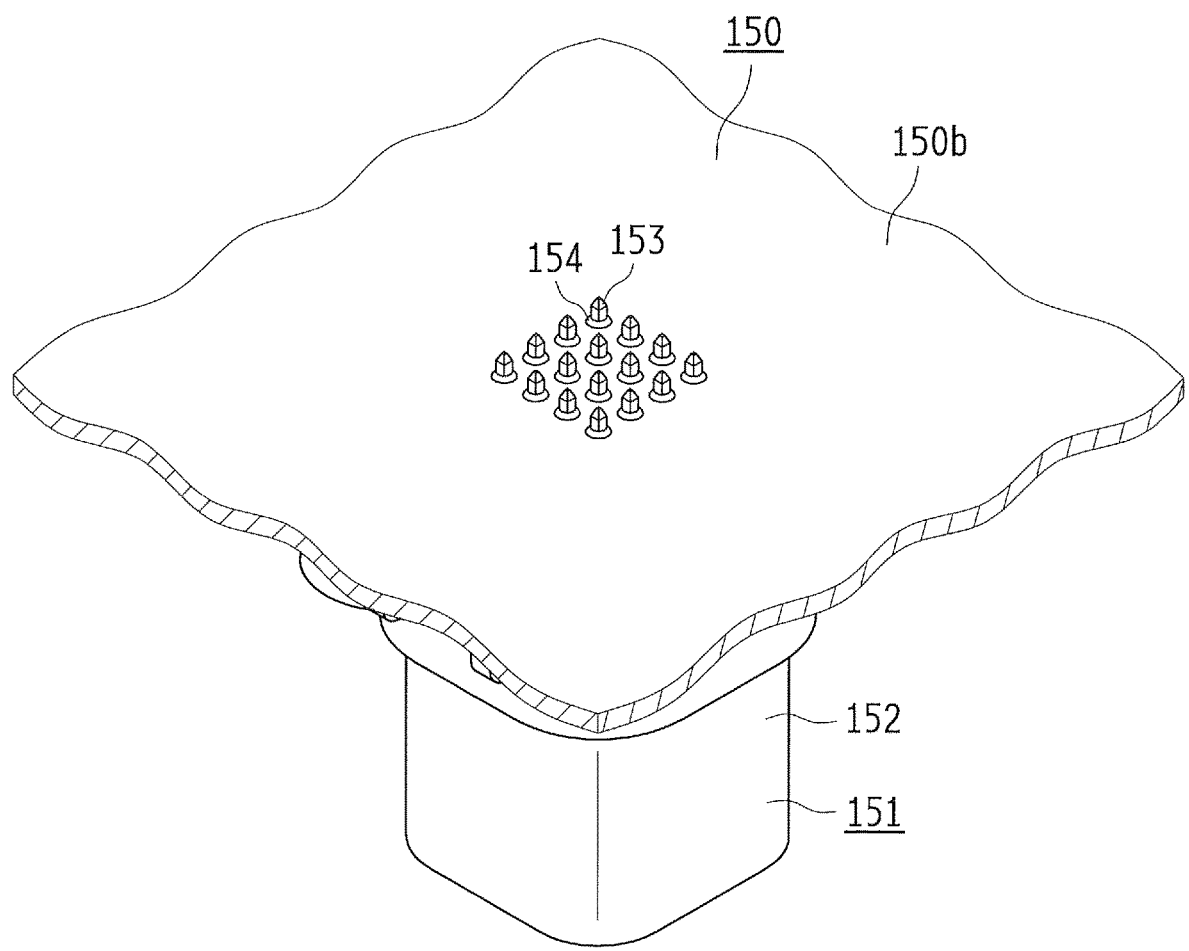
FIG. 4 is a perspective view illustrating a rear side of the wiring board in FIG. 3.

The conductive pins 153 are held by the housing 152. The pins 153 are each formed in a bar shape, and are arranged in the insert port of the housing 152. Also, each pin 153 is inserted into a corresponding through hole (not shown) formed in the wiring board 150, and fixed to the wiring board 150 by the solder 154. That is, each space between the through hole of the wiring board 150 and the pin 153 is filled with the solder 154, and thus, the pins 153 and the wiring pattern (not shown) of the wiring board 150 are electrically connected to each other via the solder 154. As shown in FIG. 4, a lower end of each pin 153 protrudes from a rear surface 150b of the wiring board 150. Also, in the example shown in FIGS. 3 and 4, the pins 153 are appropriately attached to the wiring board 150 by soldering.

Figure 5:
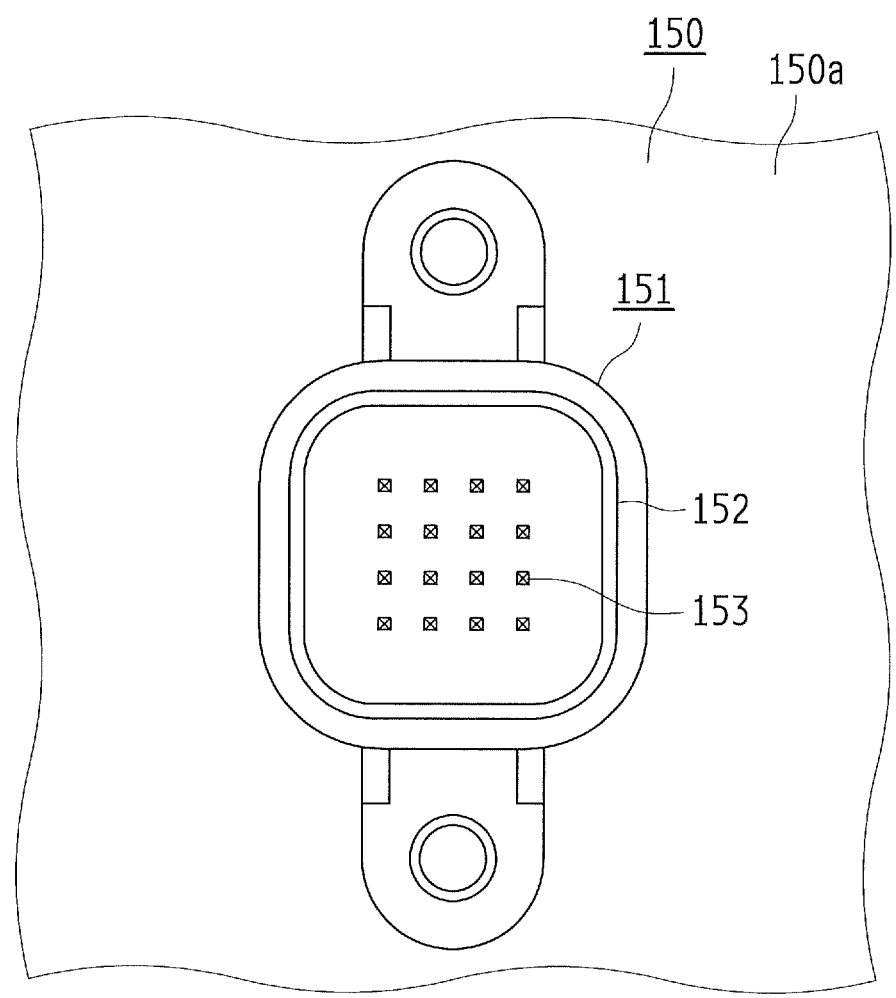
FIG. 5 is a plan view illustrating the connector of the wiring board in FIG. 3.

In the connector 151, the plurality of pins 153 is arranged in a matrix in plan view, as shown in FIG. 5. That is, the plurality of pins 153 is arranged at predetermined intervals in the row direction and in the column direction. In the example shown in FIG. 5, 16 pins 153 are disposed so as to be arranged in a matrix with 4 rows and 4 columns.

Here, if the soldering is not appropriately performed, a solder bridge (not shown) may be formed between the pins 153 adjacent to each other. When the solder bridge is formed, the adjacent pins 153 are short-circuited via the solder bridge, which results in generation of the short circuit failure. Thus, the inspection device 100 is configured to inspect if there is any short circuit failure at the soldered parts of the pins 153 of the connector 151 provided on the wiring board 150. The inspection device 100 includes: a connector 1 (see FIG. 1); a connector 2 (see FIG. 2); and a measuring instrument 3 (see FIGS. 1 and 2).

—Connector 1—

Figure 6:
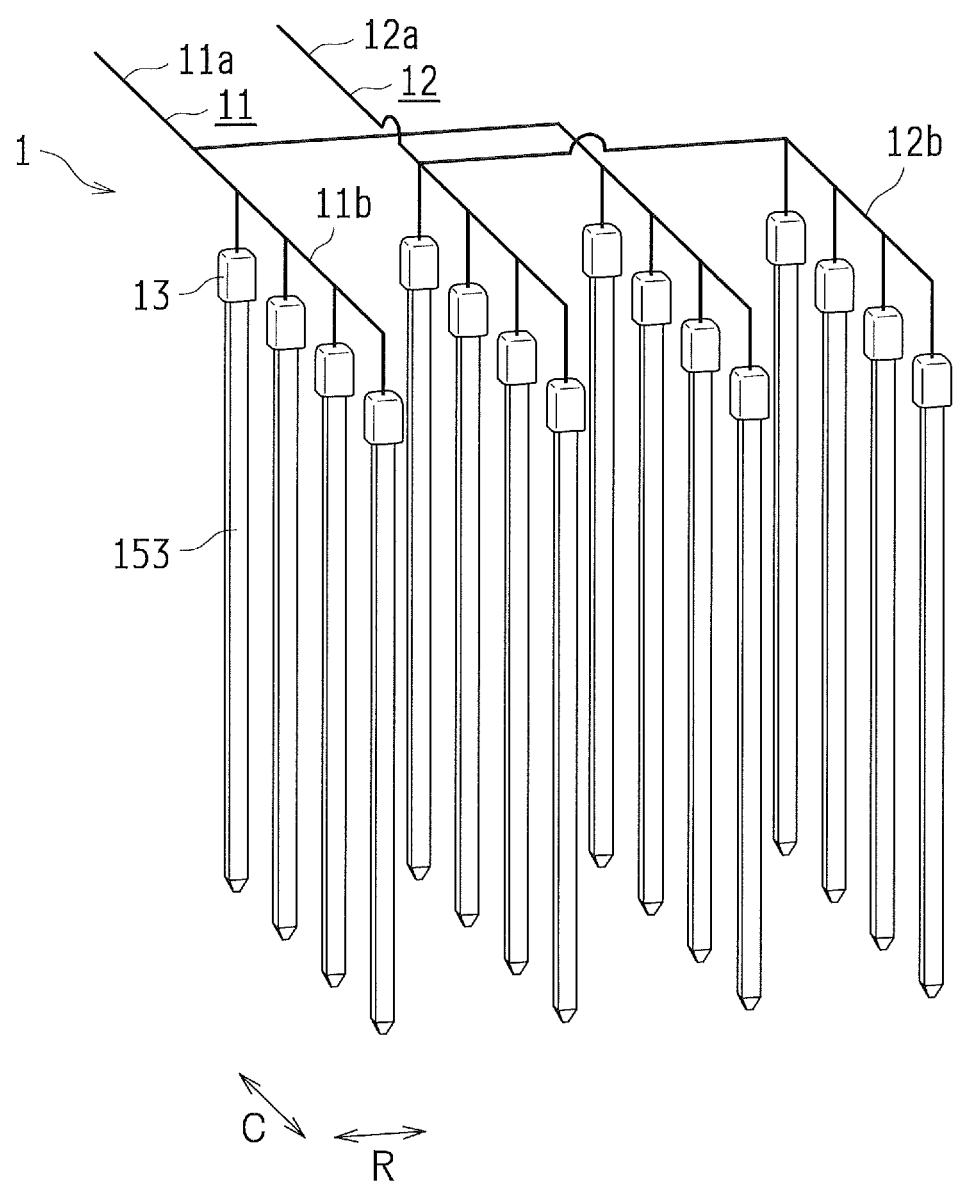
FIG. 6 is a diagram indicating an electrically connected state when the connector for row wise inspection of the inspection device is engaged with the connector of the wiring board in the first embodiment.

The connector 1 is used when inspecting insulation between the pins 153 adjacent to each other in the row direction. As shown in FIG. 6, the connector 1 includes: a wiring 11 to be connected to the pins 153 in the odd-numbered columns; and a wiring 12 to be connected to the pins 153 in the even-numbered columns. More specifically, the connector 1 includes: the wiring 11; the wiring 12; terminals 13; and a housing 14 (see FIG. 1). The wirings 11 and 12 as well as the terminals 13 have conduction properties while the housing 14 has insulation properties. In FIG. 6, for the sake of description, the pins 153 and the terminals 13 are extracted to be shown while the wiring board 150 and the housings 152 and 14 are omitted. Also, the wirings 11 and 12 are respectively examples of a "first wiring" and a "second wiring" of the present invention.

The housing 14 is detachably attached to the connector 151 of the wiring board 150. The plurality of terminals 13 is housed in the housing 14. The plurality of terminals 13 is arranged so as to respectively correspond to the plurality of pins 153 when the connector 1 is engaged with the connector 151. For this reason, the plurality of terminals 13 is arranged in a matrix in plan view at predetermined intervals in the row direction (R direction) and in the column direction (C direction). In the example shown in FIG. 6, 16 terminals 13 are arranged in a matrix with 4 rows and 4 columns. When the connector 1 is engaged with the connector 151, these terminals 13 respectively come into contact with the upper ends of the pins 153.

To the wiring 11, the terminals 13 arranged in the odd-numbered columns are connected out of the terminals 13 arranged in the matrix with 4 rows and 4 columns. More specifically, to the wiring 11 are connected 4 terminals 13 arranged in the first column and 4 terminals 13 arranged in the third column. In other words, every other column of terminals 13 in the row direction is connected to the wiring 11. In the wiring 11, a first end part 11a is drawn out of the housing 14 such that the first end part 11a can be connected to the measuring instrument 3. Also, the wiring 11 has a wiring part 11b that is housed in the housing 14 so as to be connected to the terminals 13 in the odd-numbered columns. The terminals 13 in the odd-numbered columns are connected in parallel to the wiring 11.

To the wiring 12, the terminals 13 arranged in the even-numbered columns are connected out of the terminals 13 arranged in the matrix with 4 rows and 4 columns. More specifically, to the wiring 12 are connected 4 terminals 13 arranged in the second column and 4 terminals 13 arranged in the fourth column. In other words, every other column of terminals 13 (i.e. the remaining terminals 13 that are not connected to the wiring 11) in the row direction is connected to the wiring 12. In the wiring 12, a first end part 12a is drawn out of the housing 14 such that the first end part 12a can be connected to the measuring instrument 3. Also, the wiring 12 has a wiring part 12b that is housed in the housing 14 so as to be connected to the terminals 13 in the even-numbered columns. The terminals 13 in the even-numbered columns are connected in parallel to the wiring 12.

—Connector 2—

Figure 7:
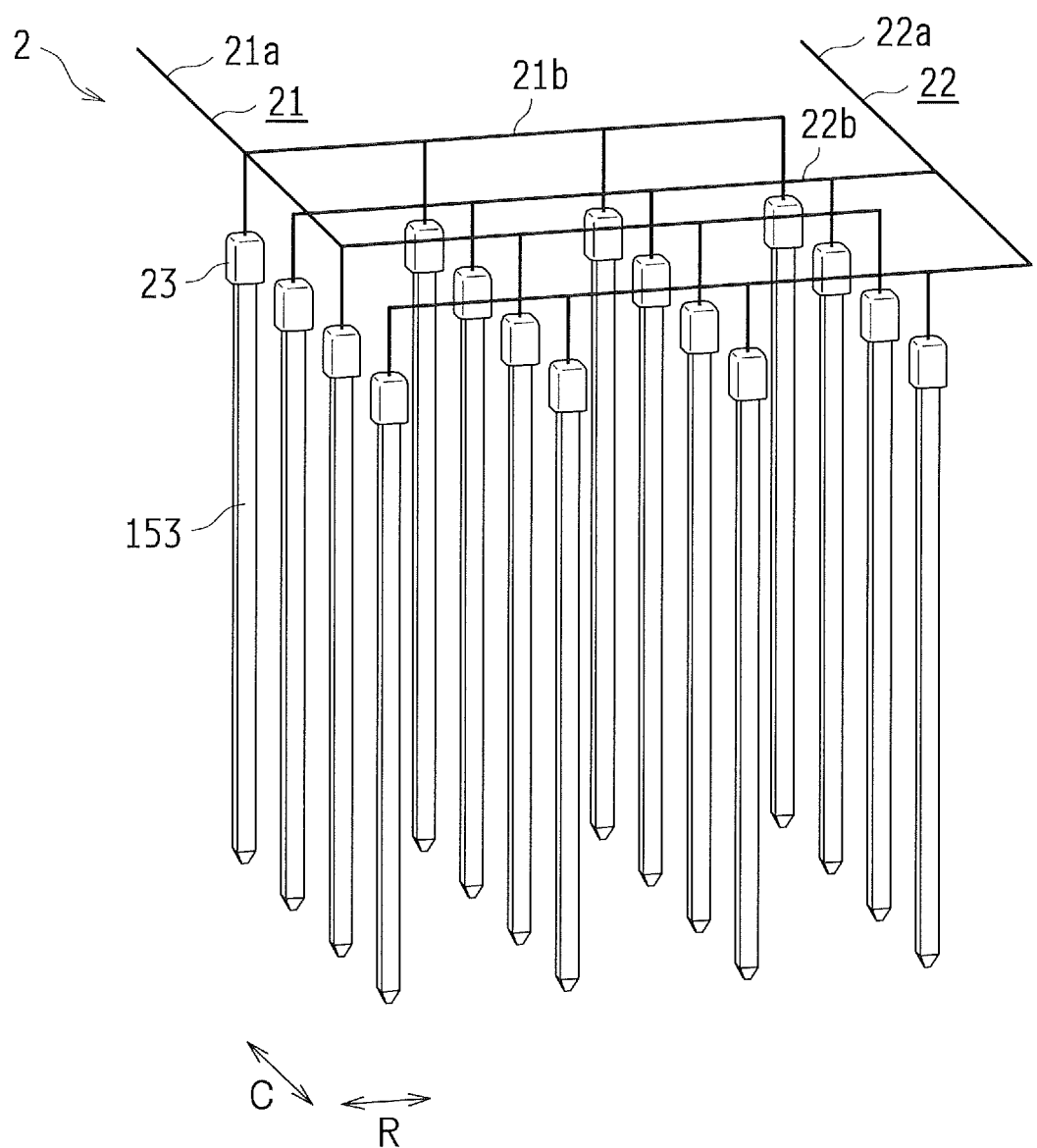
FIG. 7 is a diagram indicating an electrically connected state when the connector for column wise inspection of the inspection device is engaged with the connector of the wiring board in the first embodiment.

The connector 2 is used when inspecting insulation between the pins 153 adjacent to each other in the column direction. As shown in FIG. 7, the connector 2 includes a wiring 21 to be connected to the pins 153 in the odd-numbered rows, and a wiring 22 to be connected to the pins 153 in the even-numbered rows. More specifically, the connector 2 includes: the wiring 21; the wiring 22; terminals 23; and a housing 24 (see FIG. 2). The wirings 21 and 22 as well as the terminals 23 have conduction properties while the housing 24 has insulation properties. In FIG. 7, for the sake of description, the pins 153 and the terminals 23 are extracted to be shown while the wiring board 150 and the housings 152 and 24 are omitted. Also, the wirings 21 and 22 are respectively examples of the "first wiring" and the "second wiring" of the present invention.

The housing 24 is detachably attached to the connector 151 of the wiring board 150. The plurality of terminals 23 is housed in the housing 24. The plurality of terminals 23 is arranged so as to respectively correspond to the plurality of pins 153 when the connector 2 is engaged with the connector 151. For this reason, the plurality of terminals 23 is arranged in a matrix in plan view at predetermined intervals in the row direction (R direction) and in the column direction (C direction). In the example shown in FIG. 7, 16 terminals 23 are arranged in a matrix with 4 rows and 4 columns. When the connector 2 is engaged with the connector 151, these terminals 23 respectively come into contact with the upper ends of the pins 153.

To the wiring 21, the terminals 23 arranged in the odd-numbered rows are connected out of the terminals 23 arranged in the matrix with 4 rows and 4 columns. More specifically, to the wiring 21 are connected 4 terminals 23 arranged in the first row and 4 terminals 23 arranged in the third row. In other words, every other row of terminals 23 in the column direction is connected to the wiring 21. In the wiring 21, a first end part 21a is drawn out of the housing 24 such that the first end part 21a can be connected to the measuring instrument 3. Also, the wiring 21 has a wiring part 21b that is housed in the housing 24 so as to be connected to the terminals 23 in the odd-numbered rows. The terminals 23 in the odd-numbered rows are connected in parallel to the wiring 21.

To the wiring 22, the terminals 23 arranged in the even-numbered rows are connected out of the terminals 23 arranged in the matrix with 4 rows and 4 columns. More specifically, to the wiring 22 are connected 4 terminals 23 arranged in the second row and 4 terminals 23 arranged in the fourth row. In other words, every other row of terminals 13 (i.e. the remaining terminals 13 that are not connected to the wiring 21) in the column direction is connected to the wiring 22. In the wiring 22, a first end part 22a is drawn out of the housing 24 such that the first end part 22a can be connected to the measuring instrument 3. Also, the wiring 22 has a wiring part 22b that is housed in the housing 24 so as to be connected to the terminals 23 in the even-numbered rows. The terminals 23 in the even-numbered rows are connected in parallel to the wiring 22.

—Measuring Instrument 3—

Figure 8:
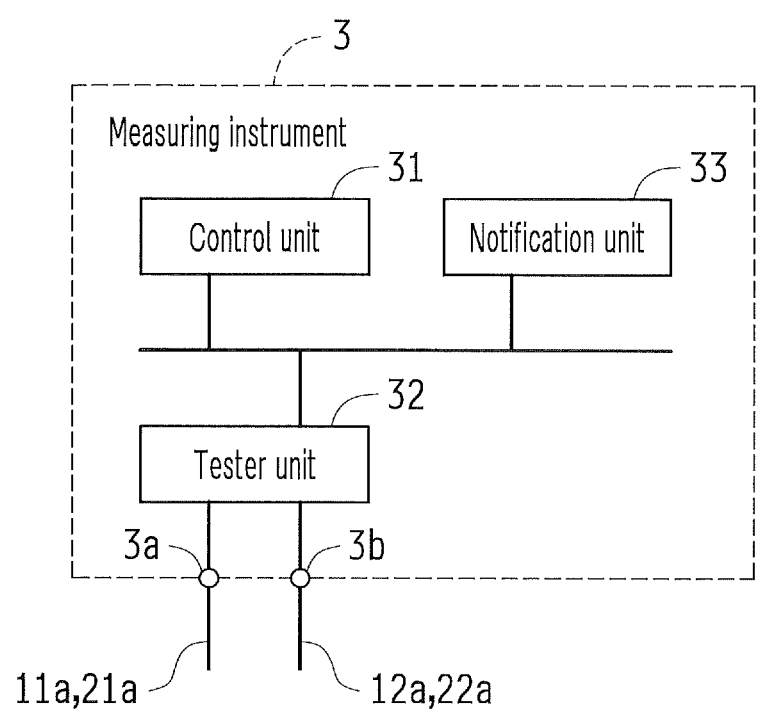
FIG. 8 is a block diagram indicating a configuration of a measuring instrument of the inspection device in the first embodiment.

The measuring instrument 3 can be connected to the connector 1 or the connector 2 so as to inspect insulation between adjacent pins 153. Either the connector 1 or the connector 2 is selectively connected to the measuring instrument 3. When the inspection is performed using the connector 1, the insulation between the adjacent pins 153 in the row direction is inspected. When the inspection is performed using the connector 2, the insulation between the adjacent pins 153 in the column direction is inspected. As shown in FIG. 8, the measuring instrument 3 includes: a control unit 31; a tester unit 32; and a notification unit 33. Also, the tester unit 32 is an example of an "inspection unit" of the present invention.

The control unit 31 includes a CPU, a ROM, a RAM and the like, and is configured to control the measuring instrument 3. The tester unit 32 is configured to measure, for example, a resistance value between the pins 153 arranged in a matrix. Specifically, the tester unit 32 can be connected to the first end part 11a of the wiring 11 and to the first end part 12a of the wiring 12 via terminals 3a and 3b, and also can be connected to the first end part 21a of the wiring 21 and to the first end part 22a of the wiring 22 via the terminals 3a and 3b. When the wiring 11 and wiring 12 are connected to the measuring instrument 3, the tester unit 32 measures the resistance value between the adjacent pins 153 in the row direction. When the wiring 21 and the wiring 22 are connected to the measuring instrument 3, the tester unit 32 measures the resistance value between the adjacent pins 153 in the column direction.

The control unit 31 determines that there is no short circuit failure when the resistance value measured using the tester unit 32 is not less than a predetermined value. Also it determines that there is a short circuit failure when the resistance value measured using the tester unit 32 is less than the predetermined value. The predetermined value is a value set in advance, which is a threshold value to determine whether the short circuit occurs between the adjacent pins 153 due to the solder bridge. The notification unit 33 is, for example, a buzzer that is configured to sound an alert when the control unit 31 determines that there is a short circuit failure.

—Inspection Method Using Inspection Device 100—

Here, an inspection method is described with reference to FIGS. 1 to 9, in which the short circuit failure of the soldered part is inspected using the inspection device 100 of the first embodiment. Note that the steps stated below are executed by the control unit 31 of the measuring instrument 3 (see FIG. 8).

Figure 9:
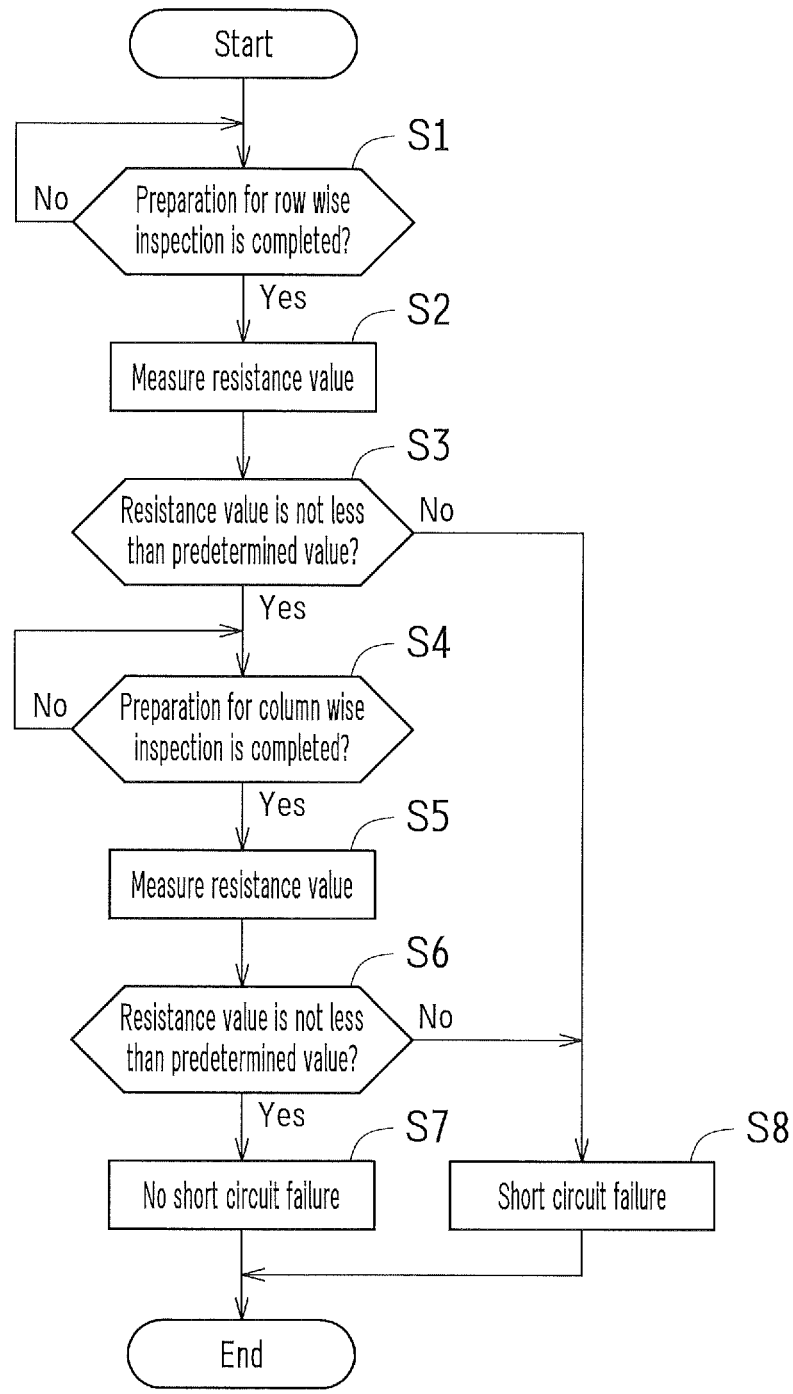
FIG. 9 is a flowchart indicating an inspection method using the inspection device of the first embodiment.

First, in Step S1 in FIG. 9, it is determined whether the preparation for row wise inspection using the connector 1 is completed. For example, it is determined that the preparation for row wise inspection is completed when the connector 1 is engaged with the connector 151 of the wiring board 150 as shown in FIG. 1 and furthermore the first end part 11a of the wiring 11 and the first end part 12a of the wiring 12 are respectively connected to the terminals 3a and 3b of the measuring instrument 3 (see FIG. 8). When it is determined that the preparation for row wise inspection is completed, the procedure advances to Step S2. On the other hand, when it is determined that the preparation for row wise inspection is not yet completed, Step S1 is repeatedly preformed. That is, the procedure does not advance until the preparation for row wise inspection is completed.

Next, in Step S2, the resistance between the wiring 11 and the wiring 12, that is, the resistance between the adjacent pins 153 in the row direction is measured using the tester unit 32 (see FIG. 8). Here, when the connector 1 is engaged with the connector 151, the pins 153 in the first column and in the third column are connected to the wiring 11 while the pins 153 in the second column and in the fourth column are connected to the wiring 12, as shown in FIG. 6. For this reason, if a solder bridge (not shown) is formed between any pins 153 adjacent to each other in the row direction (R direction), the wiring 11 and the wiring 12 are short-circuited via the solder bridge, and accordingly the resistance value between the wiring 11 and the wiring 12 is less than the predetermined value. In contrast, when no solder bridge is formed between any pins 153 adjacent to each other in the row direction, the wiring 11 and the wiring 12 are not short-circuited, and accordingly, the resistance value between the wiring 11 and the wiring 12 is not less than the predetermined value.

Next, in Step S3, it is determined whether the resistance value measured in Step S2 is not less than the predetermined value. When it is determined that the resistance value is not less than the predetermined value, the procedure advances to Step S4. On the other hand, when it is determined that the resistance value is less than the predetermined value, the procedure advances to Step S8.

Next, in Step S4, it is determined whether the preparation for column wise inspection using the connector 2 is completed. For example, it is determined that the preparation for column wise inspection is completed when the connector 2 is engaged with the connector 151 of the wiring board 150 as shown in FIG. 2 and furthermore the first end part 21a of the wiring 21 and the first end part 22a of the wiring 22 are respectively connected to the terminals 3a and 3b of the measuring instrument 3. When it is determined that the preparation for column wise inspection is completed, the procedure advances to Step S5. On the other hand, when it is determined that the preparation for column wise inspection is not yet completed, Step S4 is repeatedly preformed. That is, the procedure does not advance until the preparation for column wise inspection is completed.

Next, in Step S5, the resistance between the wiring 21 and the wiring 22, that is, the resistance between the adjacent pins 153 in the column direction is measured using the tester unit 32. Here, when the connector 2 is engaged with the connector 151, the pins 153 in the first row and the third row are connected to the wiring 21 while the pins 153 in the second row and the fourth row are connected to the wiring 22, as shown in FIG. 7. For this reason, if a solder bridge is formed between any pins 153 adjacent to each other in the column direction (C direction), the wiring 21 and the wiring 22 are short-circuited via the solder bridge, and accordingly, the resistance value between the wiring 21 and the wiring 22 is less than the predetermined value. In contrast, when no solder bridge is formed between any pins 153 adjacent to each other in the column direction, the wiring 21 and the wiring 22 are not short-circuited, and accordingly the resistance value between the wiring 21 and the wiring 22 is not less than the predetermined value.

Next, in Step S6, it is determined whether the resistance value measured in Step S5 is not less than the predetermined value. This predetermined value is, for example, the same value as that in Step S3. When it is determined that the resistance value is not less than the predetermined value, the procedure advances to Step S7. On the other hand, when it is determined that the resistance value is less than the predetermined value, the procedure advances to Step S8.

Then in Step S7, it is determined that there is no short circuit failure. That is, it is determined that no pins 153 adjacent to each other in the row direction are short-circuited and furthermore no pins 153 adjacent to each other in the column direction are short-circuited. In this case, the notification unit 33 (see FIG. 8) may notify a worker of the fact that there is no short circuit failure. After that, the procedure advances to the end.

Also in Step S8, it is determined that there is a short circuit failure. That is, it is determined that at least any pair of pins 153 adjacent to each other in the row direction or in the column direction is short-circuited. In this case, the notification unit 33 notifies the worker of the fact that there is a short circuit failure. After that, the procedure advances to the end.

—Effects—

In the first embodiment as described above, the inspection device 100 has a configuration including: the wiring 11 (21) that is connected to the certain pins 153; the wiring 12 (22) that is connected to the remaining pins 153; and the measuring instrument 3 that inspects insulation between the wiring 11 (21) and the wiring 12 (22). Thus, when a solder bridge is formed between the adjacent pins 153, the measuring instrument 3 can confirm conduction via the solder bridge. Accordingly, it is possible to detect the short circuit failure. When no solder bridge is formed between the adjacent pins 153, the measuring instrument 3 can confirm insulation between the adjacent pins 153. Therefore, it is possible to detect the short circuit failure even when the appearance of the soldered part cannot be inspected due to the connector 151 provided on the wiring board 150.

Also in the first embodiment, since the wiring 11 is connected to the pins 153 in the odd-numbered columns while the wiring 12 is connected to the pins 153 in the even-numbered columns, it is possible to confirm whether the solder bridge is formed between the adjacent pins 153 in the row direction. In other words, the short circuit failure can be detected when the solder bridge is formed between any pins 153 adjacent to each other in the row direction, which results in a collective inspection between the adjacent pins 153 in the row direction.

Also in the first embodiment, since the wiring 21 is connected to the pins 153 in the odd-numbered rows while the wiring 22 is connected to the pins 153 in the even-numbered rows, it is possible to confirm whether the solder bridge is formed between the adjacent pins 153 in the column direction. In other words, the short circuit failure can be detected when the solder bridge is formed between any pins 153 adjacent to each other in the column direction, which results in a collective inspection between the adjacent pins 153 in the column direction.

Also in the first embodiment, only twice inspections are required to confirm whether any solder bridge is formed between all the pins 153, that is, it is sufficient to perform the row wise inspection of the short circuit failure and the column wise inspection of the short circuit failure.

Second Embodiment

An inspection device 100a according to a second embodiment of the present invention is described with reference to FIGS. 10 to 14.

Figure 10:
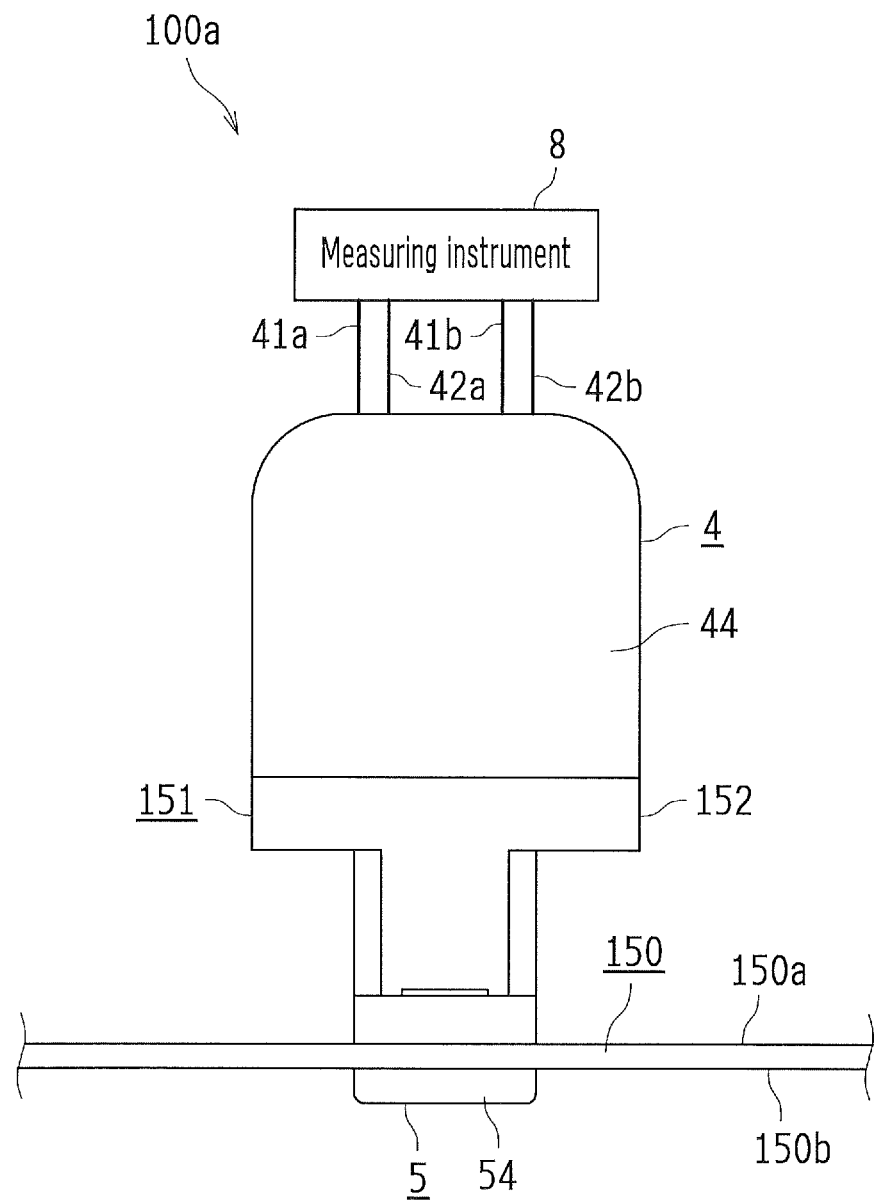
FIG. 10 is a schematic diagram indicating an inspection device according to a second embodiment, which illustrates a state in which a connector for row wise inspection of the inspection device is engaged with a connector of a wiring board, and in which a board for row wise inspection is attached to a rear surface of the wiring board.
Figure 11:
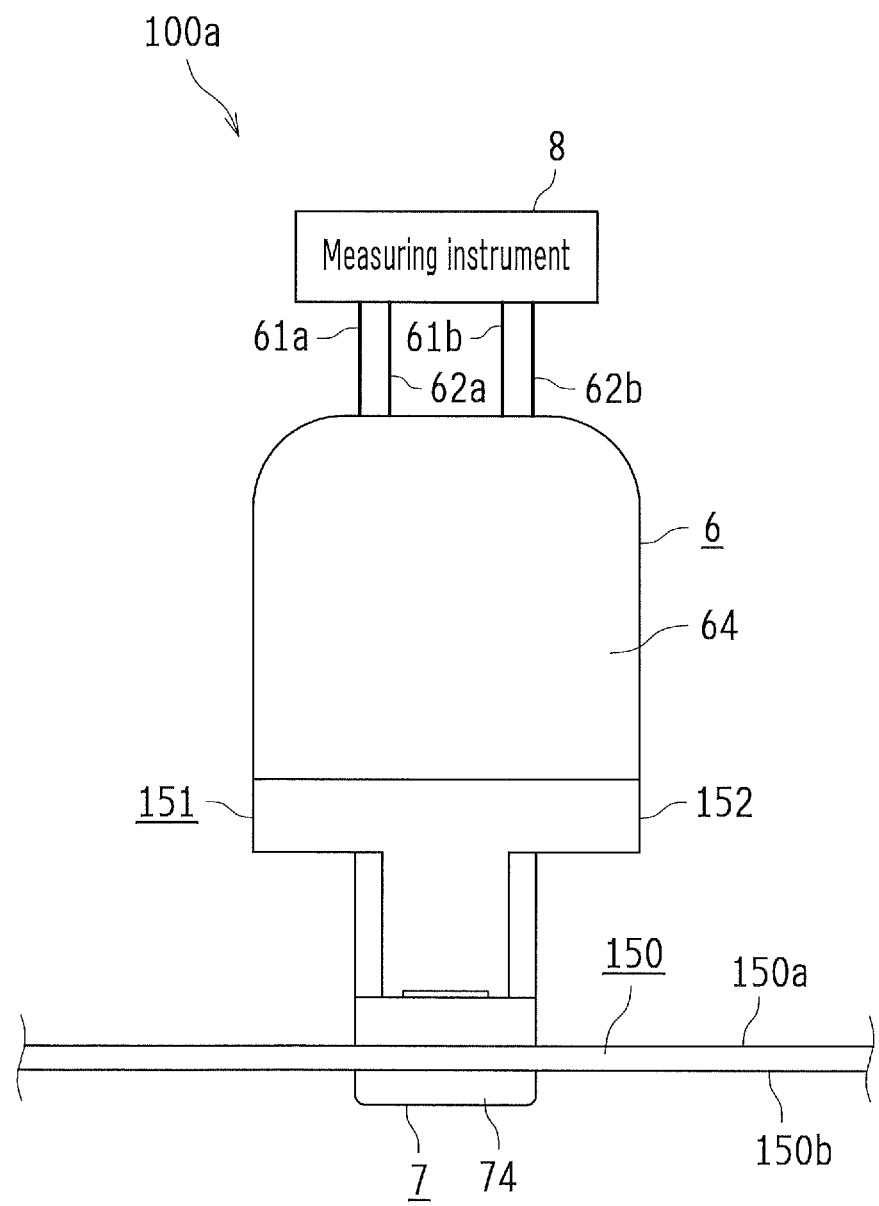
FIG. 11 is a schematic diagram indicating the inspection device according to the second embodiment, which illustrates a state in which a connector for column wise inspection of the inspection device is engaged with the connector of the wiring board, and in which a board for column wise inspection is attached to the rear surface of the wiring board.

As shown in FIGS. 10 and 11, the inspection device 100a is configured to inspect the short circuit failure of the soldered part of the wiring board 150. The inspection device 100a includes: a connector 4 and a board 5 (see FIG. 10); a connector 6 and a board 7 (see FIG. 11); and a measuring instrument 8. This inspection device 100a is configured to detect a contact failure between the pins 153 and the terminals 43, 53, 63 and 73, as described later.

—Connector 4 and Board 5—

Figure 12:
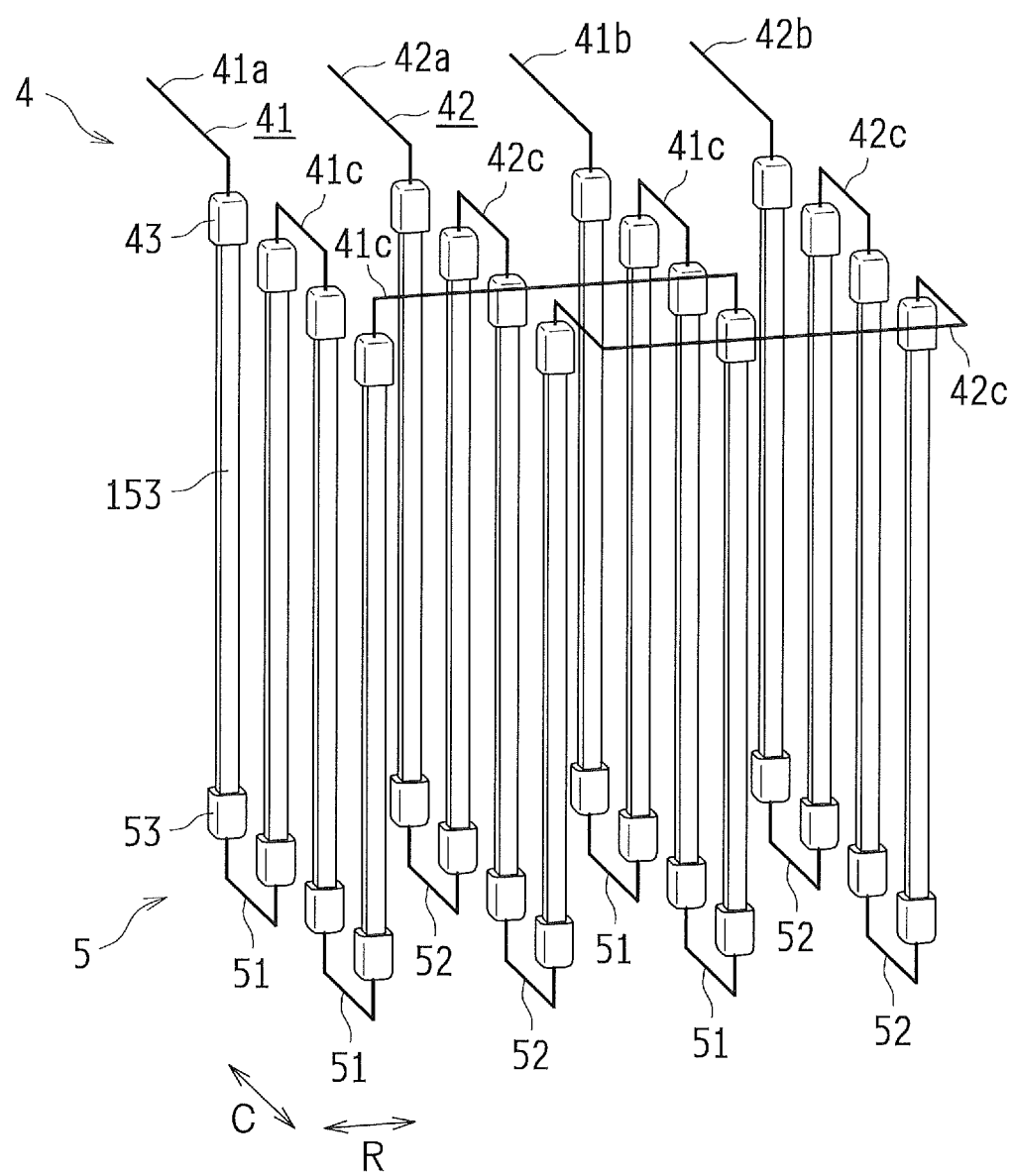
FIG. 12 is a diagram indicating an electrically connected state when the connector for row wise inspection of the inspection device is engaged with the connector of the wiring board while the board for row wise inspection is attached to the rear surface of the wiring board in the second embodiment.

The connector 4 and the board 5 are used to inspect insulation between the adjacent pins 153 in the row direction. The connector 4 is detachably attached to the connector 151 of the wiring board 150 while the board 5 is detachably attached to the rear surface 150b of the wiring board 150, on a region where the pins 153 are arranged. As shown in FIG. 12, the connector 4 and the board 5 are provided with: a wiring 41 to be connected to the pins 153 in the odd-numbered columns; and a wiring 42 to be connected to the pins 153 in the even-numbered columns. The wiring 41 and the wiring 42 are respectively examples of the "first wiring" and the "second wiring" of the present invention.

More specifically, the connector 4 includes: a first end part 41a and a second end part 41b of the wiring 41; wiring parts 41c constructing parts of the wiring 41; a first end part 42a and a second end part 42b of the wiring 42; wiring parts 42c constructing parts of the wiring 42; the terminals 43; and a housing 44 (see FIG. 10). The board 5 includes: wiring parts 51 constructing parts of the wiring 41; wiring parts 52 constructing parts of the wiring 42; the terminals 53; and a housing 54 (see FIG. 10). The wirings 41 and 42 as well as the terminals 43 and 53 have conduction properties while the housings 44 and 54 have insulation properties. In FIG. 12, for the sake of description, the pins 153 and the terminals 43 and 53 are extracted to be shown while the wiring board 150 and the housings 152, 44 and 54 are omitted. Also, the terminals 43 and 53 are respectively examples of "upper terminals" and "lower terminals" of the present invention. The wiring parts 41c and 51 are respectively examples of "first wiring parts" and "second wiring parts" of the present invention. The wiring parts 42c and 52 are respectively examples of "third wiring parts" and "fourth wiring parts" of the present invention.

The housing 44 is detachably attached to the connector 151. The plurality of terminals 43 are housed in the housing 44. The plurality of terminals 43 are arranged so as to respectively correspond to the plurality of pins 153 when the connector 4 is engaged with the connector 151. For this reason, the plurality of terminals 43 is arranged in a matrix in plan view at predetermined intervals in the row direction (R direction) and in the column direction (C direction). In the example shown in FIG. 12, 16 terminals 43 are arranged in a matrix with 4 rows and 4 columns. When the connector 4 is engaged with the connector 151, these terminals 43 respectively come into contact with the upper ends of the pins 153.

The housing 54 is detachably attached to the rear surface 150b of the wiring board 150. The plurality of terminals 53 is housed in the housing 54. The plurality of terminals 53 is arranged so as to respectively correspond to the plurality of pins 153 when the board 5 is attached to the wiring board 150. For this reason, the plurality of terminals 53 is arranged in a matrix in plan view at predetermined intervals in the row direction and in the column direction. In the example shown in FIG. 12, 16 terminals 53 are arranged in a matrix with 4 rows and 4 columns. When the board 5 is attached to the wiring board 150, these terminals 53 respectively come into contact with the lower ends of the pins 153.

In the wiring 41, the first end part 41a and the second end part 41b are drawn out of the housing 44 such that the first end part 41a and the second end part 41b can be connected to the measuring instrument 8. Also, the wiring 41 has the wiring parts 41c that are housed in the housing 44 and the wiring parts 51 that are housed in the housing 54. The wiring parts 41c connect the terminals 43 in the odd-numbered columns while the wiring parts 51 connect the terminals 53 in the odd-numbered columns. The wiring parts 41c and the wiring parts 51 are alternately arranged. Therefore, the pins 153 in the odd-numbered columns are arranged in series so as to be connected to the wiring 41. Specifically, in the example shown in FIG. 12, the pins 153 in the odd-numbered columns are connected to the wiring 41, from the first end part 41a to the second end part 41b, in the following order: the pin 153 in the first row and the first column; the pin 153 in the second row and the first column; the pin 153 in the third row and the first column; the pin 153 in the fourth row and the first column; the pin 153 in the fourth row and the third column; the pin 153 in the third row and the third column; the pin 153 in the second row and the third column; and the pin 153 in the first row and the third column.

In the wiring 42, the first end part 42a and the second end part 42b are drawn out of the housing 44 such that the first end part 42a and the second end part 42b can be connected to the measuring instrument 8. Also, the wiring 42 has the wiring parts 42c that are housed in the housing 44 and the wiring parts 52 that are housed in the housing 54. The wiring parts 42c connect the terminals 43 in the even-numbered columns while the wiring parts 52 connect the terminals 53 in the even-numbered columns. The wiring parts 42c and the wiring parts 52 are alternately arranged. Therefore, the pins 153 in the even-numbered columns are arranged in series so as to be connected to the wiring 42. Specifically, in the example shown in FIG. 12, the pins 153 in the even-numbered columns are connected to the wiring 42, from the first end part 42a to the second end part 42b, in the following order: the pin 153 in the first row and the second column; the pin 153 in the second row and the second column; the pin 153 in the third row and the second column; the pin 153 in the fourth row and the second column; the pin 153 in the fourth row and the fourth column; the pin 153 in the third row and the fourth column; the pin 153 in the second row and the fourth column; and the pin 153 in the first row and the fourth column.

—Connector 6 and Board 7—

Figure 13:
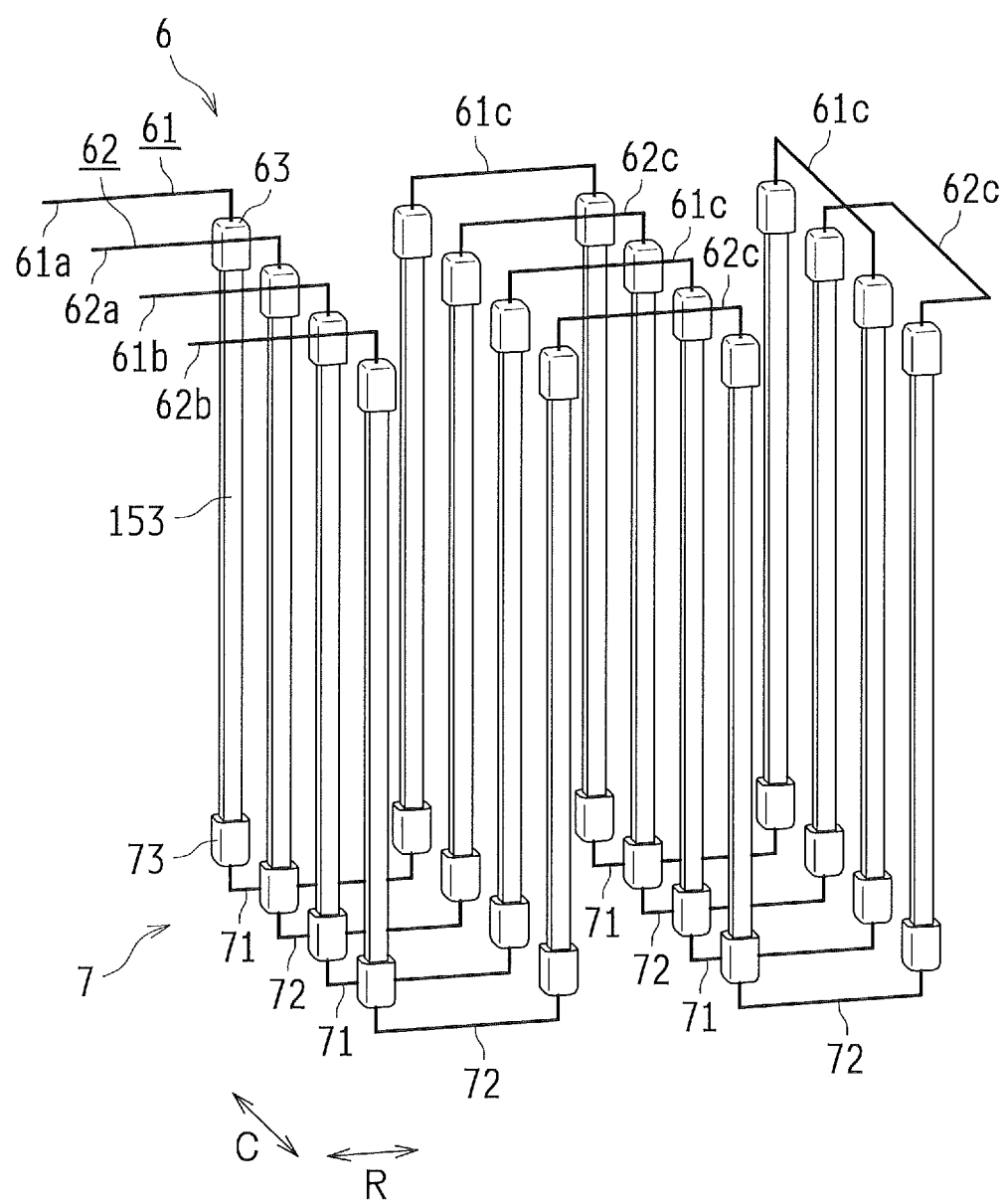
FIG. 13 is a diagram indicating an electrically connected state when the connector for column wise inspection of the inspection device is engaged with the connector of the wiring board while the board for column wise inspection is attached to the rear surface of the wiring board in the second embodiment.

The connector 6 and the board 7 are used to inspect insulation between the adjacent pins 153 in the column direction. The connector 6 is detachably attached to the connector 151 of the wiring board 150 while the board 7 is detachably attached to the rear surface 150b of the wiring board 150, on a region where the pins 153 are arranged. As shown in FIG. 13, the connector 6 and the board 7 are provided with: a wiring 61 to be connected to the pins 153 in the odd-numbered rows; and a wiring 62 to be connected to the pins 153 in the even-numbered rows. The wiring 61 and the wiring 62 are respectively examples of the "first wiring" and the "second wiring" of the present invention.

More specifically, the connector 6 includes: a first end part 61a and a second end part 61b of the wiring 61; wiring parts 61c constructing parts of the wiring 61; a first end part 62a and a second end part 62b of the wiring 62; wiring parts 62c constructing parts of the wiring 62; the terminals 63; and a housing 64 (see FIG. 11). The board 7 includes: wiring parts 71 constructing parts of the wiring 61; wiring parts 72 constructing parts of the wiring 62; the terminals 73; and a housing 74 (see FIG. 11). The wirings 61 and 62 as well as the terminals 63 and 73 have conduction properties while the housings 64 and 74 have insulation properties. In FIG. 13, for the sake of description, the pins 153 and the terminals 63 and 73 are extracted to be shown while the wiring board 150 and the housings 152, 64 and 74 are omitted. Also, the terminals 63 and 73 are respectively examples of the "upper terminals" and the "lower terminals" of the present invention. The wiring parts 61c and 71 are respectively examples of the "first wiring parts" and the "second wiring parts" of the present invention. The wiring parts 62c and 72 are respectively examples of the "third wiring parts" and the "fourth wiring parts" of the present invention.

The housing 64 is detachably attached to the connector 151. The plurality of terminals 63 is housed in the housing 64. The plurality of terminals 63 is arranged so as to respectively correspond to the plurality of pins 153 when the connector 6 is engaged with the connector 151. For this reason, the plurality of terminals 63 is arranged in a matrix in plan view at predetermined intervals in the row direction (R direction) and in the column direction (C direction). In the example shown in FIG. 13, 16 terminals 63 are arranged in a matrix with 4 rows and 4 columns. When the connector 6 is engaged with the connector 151, these terminals 63 respectively come into contact with the upper ends of the pins 153.

The housing 74 is detachably attached to the rear surface 150b of the wiring board 150. The plurality of terminals 73 is housed in the housing 74. The plurality of terminals 73 is arranged so as to respectively correspond to the plurality of pins 153 when the board 7 is attached to the wiring board 150. For this reason, the plurality of terminals 73 is arranged in a matrix in plan view at predetermined intervals in the row direction and in the column direction. In the example shown in FIG. 13, 16 terminals 73 are arranged in a matrix with 4 rows and 4 columns. When the board 7 is attached to the wiring board 150, these terminals 73 respectively come into contact with the lower ends of the pins 153.

In the wiring 61, the first end part 61a and the second end part 61b are drawn out of the housing 64 such that the first end part 61a and the second end part 61b can be connected to the measuring instrument 8. Also, the wiring 61 has the wiring parts 61c that are housed in the housing 64 and the wiring parts 71 that are housed in the housing 74. The wiring parts 61c connect the terminals 63 in the odd-numbered rows while the wiring parts 71 connect the terminals 73 in the odd-numbered rows. The wiring parts 61c and the wiring parts 71 are alternately arranged. Therefore, the pins 153 in the odd-numbered rows are arranged in series so as to be connected to the wiring 61. Specifically, in the example shown in FIG. 13, the pins 153 in the odd-numbered rows are connected to the wiring 61, from the first end part 61a to the second end part 61b, in the following order: the pin 153 in the first row and the first column; the pin 153 in the first row and the second column; the pin 153 in the first row and the third column; the pin 153 in the first row and the fourth column; the pin 153 in the third row and the fourth column; the pin 153 in the third row and the third column; the pin 153 in the third row and the second column; and the pin 153 in the third row and the first column.

In the wiring 62, the first end part 62a and the second end part 62b are drawn out of the housing 64 such that the first end part 62a and the second end part 62b can be connected to the measuring instrument 8. Also, the wiring 62 has the wiring parts 62c that are housed in the housing 64 and the wiring parts 72 that are housed in the housing 74. The wiring parts 62c connect the terminals 63 in the even-numbered rows while the wiring parts 72 connect the terminals 73 in the even-numbered rows. The wiring parts 62c and the wiring parts 72 are alternately arranged. Therefore, the pins 153 in the even-numbered rows are arranged in series so as to be connected to the wiring 62. Specifically, in the example shown in FIG. 13, the pins 153 in the even-numbered rows are connected to the wiring 62, from the first end part 62a to the second end part 62b, in the following order: the pin 153 in the second row and the first column; the pin 153 in the second row and the second column; the pin 153 in the second row and the third column; the pin 153 in the second row and the fourth column; the pin 153 in the fourth row and the fourth column; the pin 153 in the fourth row and the third column; the pin 153 in the fourth row and the second column; and the pin 153 in the fourth row and the first column.

—Measuring Instrument 8—

Figure 14:
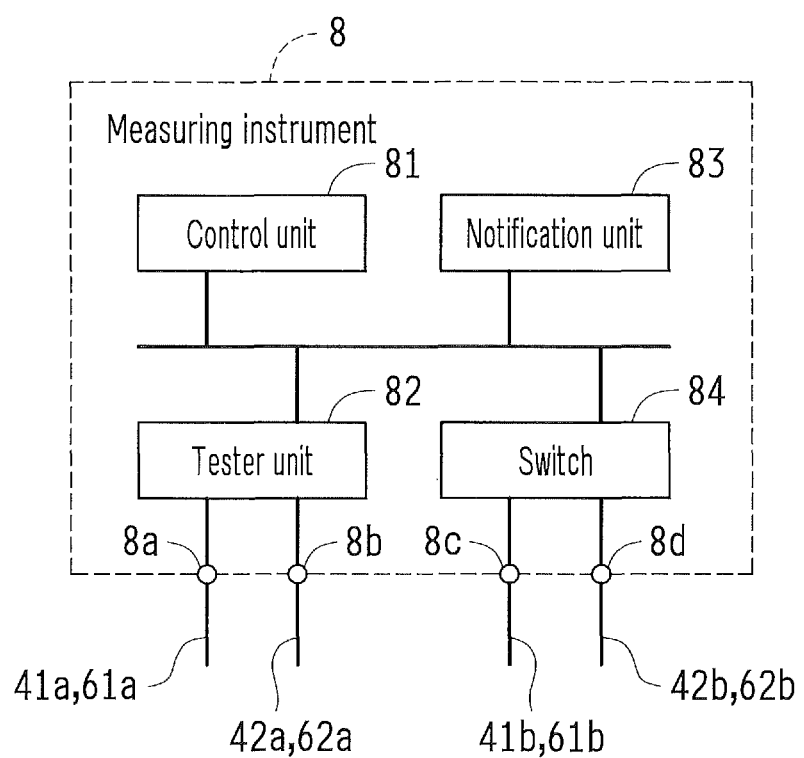
FIG. 14 is a block diagram indicating a configuration of a measuring instrument of the inspection device in the second embodiment.

The measuring instrument 8 can be connected to the connector 4 so as to inspect insulation between the adjacent pins 153 in the row direction and to confirm contact of the pins 153 with the terminals 43 and 53 before performing the insulation inspection. Also, the measuring instrument 8 can be connected to the connector 6 so as to inspect insulation between the adjacent pins 153 in the column direction and to confirm contact of the pins 153 with the terminals 63 and 73 before performing the insulation inspection. Either the connector 4 or the connector 6 is selectively connected to the measuring instrument 8. As shown in FIG. 14, the measuring instrument 8 includes: a control unit 81; a tester unit 82; a notification unit 83; and a switch 84. Also, the tester unit 82 is an example of the "inspection unit" of the present invention.

The control unit 81 includes a CPU, a ROM, a RAM and the like, and is configured to control the measuring instrument 8. The switch 84 is provided so as to electrically connect or disconnect the second end part 41b of the wiring 41 and the second end part 42b of the wiring 42, and also to electrically connect and disconnect the second end part 61b of the wiring 61 and the second end part 62b of the wiring 62. The tester unit 82 is configured, for example, to confirm conduction when the switch 84 is turned on and to measure the resistance value between the pins 153 when the switch 84 is turned off.

Specifically, the tester unit 82 can be connected to the first end part 41a of the wiring 41 and to the first end part 42a of the wiring 42 via terminals 8a and 8b while the switch 84 can be connected to the second end part 41b of the wiring 41 and to the second end part 42b of the wiring 42 via terminals 8c and 8d. Also, the tester unit 82 can be connected to the first end part 61a of the wiring 61 and to the first end part 62a of the wiring 62 via the terminals 8a and 8b while the switch 84 can be connected to the second end part 61b of the wiring 61 and to the second end part 62b of the wiring 62 via the terminals 8c and 8d. When the wiring 41 and the wiring 42 are connected to the measuring instrument 8, the tester unit 82 confirms conduction when the switch 84 is turned on, and after the conduction is confirmed, the switch 84 is turned off. Then, the tester unit 82 measures the resistance value between the adjacent pins 153 in the row direction. When the wiring 61 and the wiring 62 are connected to the measuring instrument 8, the tester unit 82 confirms conduction when the switch 84 is turned on, and after the conduction is confirmed, the switch 84 is turned off. Then, the tester unit 82 measures the resistance value between the adjacent pins 153 in the column direction.

The control unit 81 is configured to determine that there is no contact failure when the switch 84 is turned on and the conduction is confirmed, and to determine that there is a contact failure when the switch 84 is turned on and the conduction is not confirmed. Also, when the control unit 81 determines that there is no contact failure, the control unit 81 further determines that there is no short circuit failure when the resistance value measured by the tester unit 82 is not less than a predetermined value while it determines that there is a short circuit failure when the resistance value measured by the tester unit 82 is less than the predetermined value. The predetermined value is a value set in advance, which is a threshold value to determine whether the short circuit occurs between the adjacent pins 153 due to the solder bridge. The notification unit 83 is, for example, a buzzer that is configured to sound an alert when the control unit 81 determines that there is a short circuit failure or that there is a contact failure.

—Inspection Method Using Inspection Device 100a—

Here, an inspection method is described with reference to FIGS. 10 to 16, in which the short circuit failure of the soldered part is inspected using the inspection device 100a of the second embodiment. Note that the steps stated below are executed by the control unit 81 of the measuring instrument 8 (see FIG. 14).

Figure 15:
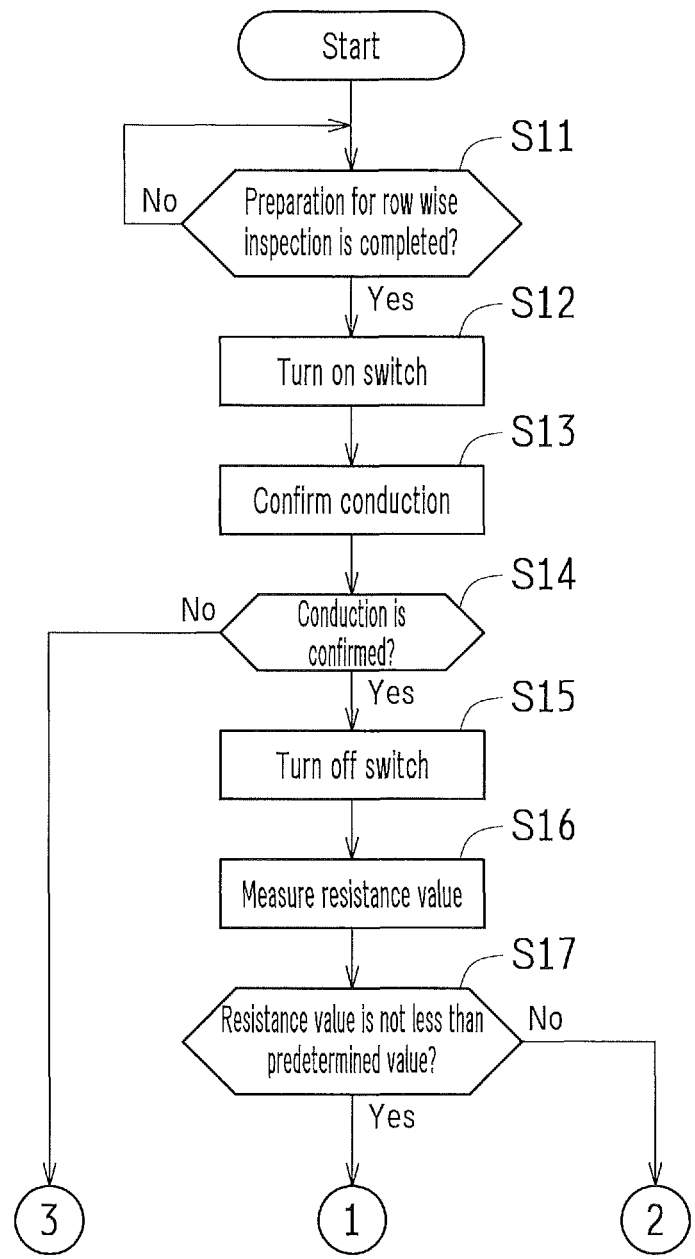
FIG. 15 is a flowchart indicating a first half of an inspection method using the inspection device of the second embodiment.

First, in Step S11 in FIG. 15, it is determined whether the preparation for row wise inspection using the connector 4 and the board 5 is completed. For example, it is determined that the preparation for row wise inspection is completed when the connector 4 is engaged with the connector 151 of the wiring board 150 while the board 5 is attached to the rear surface 150b of the wiring board 150 as shown in FIG. 10 and furthermore when the first end part 41a of the wiring 41 and the first end part 42a of the wiring 42 are respectively connected to the terminals 8*a* and 8*b* of the measuring instrument 8 (see FIG. 14) while the second end part 41*b* of the wiring 41 and the second end part 42*b* of the wiring 42 are respectively connected to the terminals 8*c* and 8*d* of the measuring instrument 8 (see FIG. 14). When it is determined that the preparation for row wise inspection is completed, the procedure advances to Step S12. On the other hand, when it is determined that the preparation for row wise inspection is not yet completed, Step S11 is repeatedly preformed. That is, the procedure does not advance until the preparation for row wise inspection is completed.

Next, in Step S12, the switch 84 (see FIG. 14) is turned on. Thus, the second end part 41*b* of the wiring 41 and the second end part 42*b* of the wiring 42 are electrically connected.

Next, in Step S13, the conduction of the wiring 41 and the conduction of the wiring 42 are confirmed by the tester unit 82 (see FIG. 14). That is, it is confirmed whether the terminals 43 of the connector 4 and the terminals 53 of the board 5 appropriately come into contact with the respective pins 153. Here, as shown in FIG. 12, since the pins 153 are arranged in series, it is considered that the conduction occurs when all the pins 153 each make contact with the corresponding terminal 43 and the corresponding terminal 53, and it is considered that the conduction does not occur when there is any contact failure between the pins 153 and the terminals 43 or between the pins 153 and the terminals 53.

Next, in Step S14, it is determined whether the conduction occurs. When it is determined that the conduction occurs, the procedure advances to Step S15. On the other hand, when it is determined that the conduction does not occur, the procedure advances to Step S27 shown in FIG. 16.

Next, in Step S15, the switch 84 is turned off. Thus, the second end part 41*b* of the wiring 41 and the second end part 42*b* of the wiring 42 are electrically disconnected.

Next, in Step S16, the resistance between the wiring 41 and the wiring 42, that is, the resistance between the adjacent pins 153 in the row direction is measured using the tester unit 82. Here, when the connector 4 is engaged with the connector 151 while the board 5 is attached to the wiring board 150, the pins 153 in the first column and in the third column are connected to the wiring 41 while the pins 153 in the second column and in the fourth column are connected to the wiring 42, as shown in FIG. 12. For this reason, if a solder bridge (not shown) is formed between any pins 153 adjacent to each other in the row direction (R direction), the wiring 41 and the wiring 42 are short-circuited via the solder bridge, and accordingly, the resistance value between the wiring 41 and the wiring 42 is less than the predetermined value. In contrast, when no solder bridge is formed between any pins 153 adjacent to each other in the row direction, the wiring 41 and the wiring 42 are not short-circuited, and accordingly, the resistance value between the wiring 41 and the wiring 42 is not less than the predetermined value.

Next, in Step S17, it is determined whether the resistance value measured in Step S16 is not less than the predetermined value. When it is determined that the resistance value is not less than the predetermined value, the procedure advances to Step S18 in FIG. 16. On the other hand, when it is determined that the resistance value is less than the predetermined value, the procedure advances to Step S26 in FIG. 16.

Figure 16:
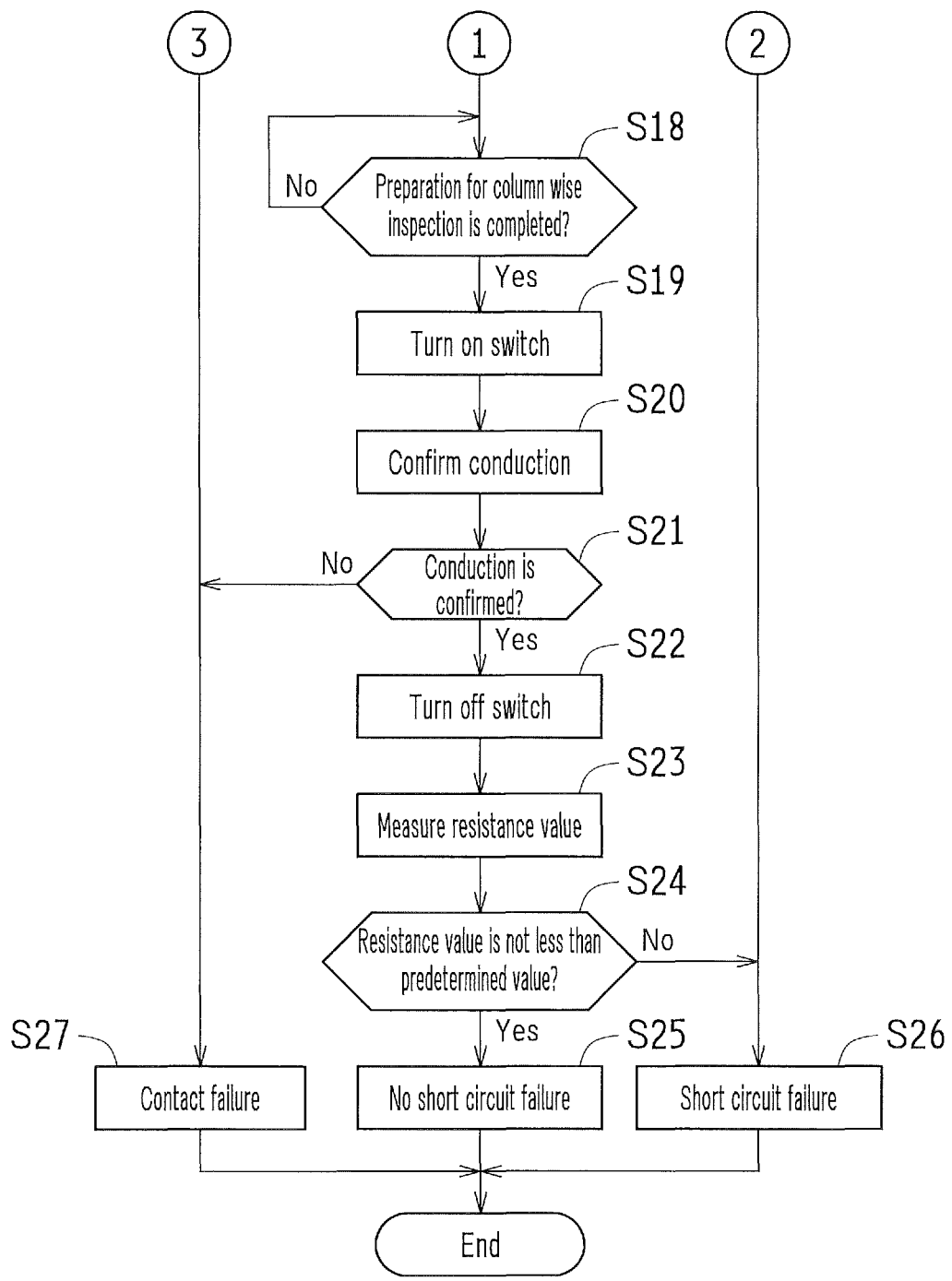
FIG. 16 is a flowchart indicating a latter half of the inspection method using the inspection device of the second embodiment.

Next, in Step S18 in FIG. 16, it is determined whether the preparation for column wise inspection using the connector 6 and the board 7 is completed. For example, it is determined that the preparation for column wise inspection is completed when the connector 6 is engaged with the connector 151 of the wiring board 150 while the board 7 is attached to the rear surface 150*b* of the wiring board 150 as shown in FIG. 11 and furthermore when the first end part 61*a* of the wiring 61 and the first end part 62*a* of the wiring 62 are respectively connected to the terminals 8*a* and 8*b* of the measuring instrument 8 while the second end part 61*b* of the wiring 61 and the second end part 62*b* of the wiring 62 are respectively connected to the terminals 8*c* and 8*d* of the measuring instrument 8.

When it is determined that the preparation for column wise inspection is completed, the procedure advances to Step S19. On the other hand, when it is determined that the preparation for column wise inspection is not yet completed, Step S18 is repeatedly preformed. That is, the procedure does not advance until the preparation for column wise inspection is completed.

Next, in Step S19, the switch 84 is turned on. Thus, the second end part 61*b* of the wiring 61 and the second end part 62*b* of the wiring 62 are electrically connected.

Next, in Step S20, the conduction of the wiring 61 and conduction of the wiring 62 are confirmed by the tester unit 82. That is, it is confirmed whether the terminals 63 of the connector 6 and the terminals 73 of the board 7 appropriately come into contact with the respective pins 153. Here, as shown in FIG. 13, since the pins 153 are arranged in series, it is considered that the conduction occurs when all the pins 153 each make contact with the corresponding terminal 63 and the corresponding terminal 73, and it is considered that the conduction does not occur when there is any contact failure between the pins 153 and the terminals 63 or between the pins 153 and the terminals 73.

Next, in Step S21, it is determined whether the conduction occurs. When it is determined that the conduction occurs, the procedure advances to Step S22. On the other hand, when it is determined that the conduction does not occur, the procedure advances to Step S27.

Next, in Step S22, the switch 84 is turned off. Thus, the second end part 61*b* of the wiring 61 and the second end part 62*b* of the wiring 62 are electrically disconnected.

Next, in Step S23, the resistance between the wiring 61 and the wiring 62, that is, the resistance between the adjacent pins 153 in the column direction is measured using the tester unit 82. Here, when the connector 6 is engaged with the connector 151 while the board 7 is attached to the wiring board 150, the pins 153 in the first row and in the third row are connected to the wiring 61 while the pins 153 in the second row and in the fourth row are connected to the wiring 62, as shown in FIG. 13. For this reason, if a solder bridge is formed between any pins 153 adjacent to each other in the column direction (C direction), the wiring 61 and the wiring 62 are short-circuited via the solder bridge, and accordingly the resistance value between the wiring 61 and the wiring 62 is less than the predetermined value. In contrast, when no solder bridge is formed between any pins 153 adjacent to each other in the column direction, the wiring 61 and the wiring 62 are not short-circuited, and accordingly, the resistance value between the wiring 61 and the wiring 62 is not less than the predetermined value.

Next, in Step S24, it is determined whether the resistance value measured in Step S23 is not less than the predetermined value. This predetermined value is, for example, the same value as that in Step S17. When it is determined that the resistance value is not less than the predetermined value, the procedure advances to Step S25. On the other hand, when it is determined that the resistance value is less than the predetermined value, the procedure advances to Step S26.

Then in Step S25, it is determined that there is no short circuit failure. That is, it is determined that no pins 153 adjacent to each other in the row direction are short-circuited and furthermore no pins 153 adjacent to each other in the column direction are short-circuited. In this case, the notification unit 83 (see FIG. 14) may notify the worker of the fact that there is no short circuit failure. After that, the procedure advances to the end.

Also in Step S26, it is determined that there is a short circuit failure. That is, it is determined that at least any pair of pins 153 adjacent to each other in the row direction or in the column direction is short-circuited. In this case, the notification unit 83 notifies the worker of the fact that there is a short circuit failure. After that, the procedure advances to the end.

Also in Step S27, it is determined that there is a contact failure. Then, it is determined that the inspection of the short circuit failure cannot be appropriately performed due to the contact failure. In this case, the notification unit 83 notifies the worker of the fact that there is a contact failure. After that, the procedure advances to the end.

—Effects—

In the second embodiment as described above, the inspection device 100a has a configuration in which the switch 84 to be connected to the second end part 41b (61b) of the wiring 41 (61) and the second end part 42b (62b) of the wiring 42 (62) is provided, and in which the pins 153 are arranged in series so as to be connected to the wirings 41 and 42 (61 and 62). Thus, it is possible to confirm whether the terminals 43 and 53 (63 and 73) appropriately come into contact with the pins 153 by confirming the conduction when the switch 84 is turned on. Accordingly, the inspection of the short circuit failure can be performed after confirming the contact between the pins 153 and the terminals 43 and 53 (63 and 73). When the contact failure occurs, electrical connection is interrupted at the part where the contact failure occurs regardless of the formation of the solder bridge, which may lead to erroneous determination in the inspection of the short circuit failure based on the resistance value, that is, it may be determined that there is no short circuit failure despite the fact that the solder bridge is formed. However, in the second embodiment, since the inspection of the short circuit failure is performed after confirming the contact, it is possible to avoid erroneous determination, due to the contact failure, that there is no short circuit failure despite the fact that the solder bridge is formed (i.e. to avoid oversight of defective products).

Other effects that are provided by the second embodiment are the same as those by the first embodiment.

Other Embodiments

The above-disclosed embodiments are to be considered in all respects as illustrative and not limiting. The scope of the invention is indicated by the appended claims rather than by the foregoing description, and all modifications and changes that come within the meaning and range of equivalency of the claims are intended to be embraced therein.

For example, in the first embodiment, the pins 153 are arranged in the matrix. However, the present invention is not limited thereto. The pins may be arranged so as to form another pattern.

Also in the first embodiment, the connector 151 is provided with a single insert port. However, the present invention is not limited thereto. The connector may have a plurality of insert ports.

Also in the first embodiment, 16 pins 153 are arranged in the matrix with 4 rows and 4 columns. However, the present invention is not limited thereto. Any number of pins may be applied, provided that the multiple pins are used. Also, the number of pins in the row direction and that in the column direction may vary. Furthermore, the number of pins in the row direction may differ from the number of pins in the column direction.

Also in the first embodiment, the notification unit 33 is exemplarily shown as a buzzer. However, the present invention is not limited thereto. The notification unit may be a display or the like.

Also in the first embodiment, the preparation for inspection may be performed manually by a worker. In this case, it can be determined that the preparation for inspection is completed, for example, when the worker operates an operating button (not shown). Also, the preparation for inspection may be automatically performed by a working robot. In this case, it can be determined whether the preparation for inspection is completed, for example, based on detection results by a sensor (not shown).

Also in the first embodiment, the predetermined value for the row wise inspection (i.e. the predetermined value in Step S3) is the same as the predetermined value for the column wise inspection (i.e. the predetermined value in Step S6). However, the present invention is not limited thereto. The predetermined value for the row wise inspection may differ from the predetermined value for the column wise inspection.

Also in the first embodiment, it is determined that there is a short circuit failure when the resistance value is less than the predetermined value. However, the present invention is not limited thereto. It may be determined that there is a short circuit failure when the conduction is confirmed.

Also in the first embodiment, both the connector 1 and the connecter 2 are connected to the measuring instrument 3. However, the present invention is not limited thereto. The measuring instrument may be provided for every connector.

Also in the first embodiment, the connector 1 for the row wise inspection and the connector 2 for the column wise inspection are provided. However, the present invention is not limited thereto. In the case in which a single connector can perform the row wise inspection and the column wise inspection by changing the direction in which the connector is connected, only such a single connector may be provided for performing the row wise inspection and the column wise inspection.

Also in the first embodiment, each step in the flowchart is performed by the control unit 31 of the measuring instrument 3. However, the present invention is not limited thereto. Each step in the flowchart may be performed by the worker.

Also in the first embodiment, the column wise inspection is performed after the row wise inspection is performed. However, the present invention is not limited thereto. The row wise inspection may be performed after the column wise inspection is performed.

The above-described variations of the first embodiment may also be applied to the second embodiment.

In the second embodiment, it is determined that the contact failure occurs when the conduction is not confirmed. However, the present invention is not limited thereto. It may be determined that the contact failure occurs when the resistance value is not less than a predetermined value. This predetermined value is a value set in advance, which is a threshold value to determine whether the pins and the terminals come into contact with each other. That is, this predetermined value is a different value from the above-described predetermined value for determining the short circuit failure.

Also in the second embodiment, the first end part 41*a* and the second end part 41*b* of the wiring 41 as well as the first end part 42*a* and the second end part 42*b* of the wiring 42 are drawn out of the housing 44 of the connector 4. However, the present invention is not limited thereto. At least one of the first end part and the second end part of the wiring may be drawn out of the housing of the board.

INDUSTRIAL APPLICABILITY

The present invention is suitably applied to an inspection device and an inspection method for inspecting a short circuit failure of a soldered part.

REFERENCE SIGNS LIST

11, 21, 41, 61 Wiring (first wiring)
12, 22, 42, 62 Wiring (second wiring)
32, 82 Tester unit (inspection unit)
41*a*, 42*a*, 61*a*, 62*a* First end part
41*b*, 42*b*, 61*b*, 62*b* Second end part
41*c*, 61*c* Wiring part (first wiring part)
42*c*, 62*c* Wiring part (third wiring part)
43, 63 Terminal (upper terminal)
51, 71 Wiring part (second wiring part)
52, 72 Wiring part (fourth wiring part)
53, 73 Terminal (lower terminal)
84 Switch
100, 100*a* Inspection device
150 Wiring board
151 Connector
153 Pin
154 Solder

What is claimed is:

1. An inspection device configured to inspect a short circuit failure generated at any connected part of a plurality of pins to a wiring board via solder, the plurality of pins being included in a connector provided on the wiring board, the inspection device comprising:
   a first wiring connected to certain pins of the plurality of pins;
   a second wiring connected to remaining pins of the plurality of pins; and
   an inspection unit connected to the first wiring and to the second wiring, and configured to measure a resistance value between adjacent pins of the plurality of pins, so as to inspect insulation between the certain pins of the plurality of pins and the remaining pins of the plurality of pins, wherein
   it is determined that there is no short circuit failure when the resistance value measured using the inspection unit is not less than a predetermined value, and the inspection unit confirms insulation between the certain pins and the remaining pins, and
   it is determined that there is a short circuit failure when the resistance value measured using the inspection unit is less than the predetermined value, and the inspection unit confirms conduction between the certain pins and the remaining pins.

2. The inspection device according to claim 1, wherein the plurality of pins is arranged in a matrix in a plan view, the first wiring is connected to pins in odd-numbered columns out of the plurality of pins,
   the second wiring is connected to pins in even-numbered columns out of the plurality of pins, and
   the inspection unit is configured to measure the resistance value between the adjacent pins in a column direction of the plurality of pins, to inspect insulation between the pins in the odd-numbered columns and the pins in the even-numbered columns.

3. The inspection device according to claim 1, wherein the plurality of pins is arranged in a matrix in a plan view,
   the first wiring is connected to pins in odd-numbered rows out of the plurality of pins,
   the second wiring is connected to pins in even-numbered rows out of the plurality of pins, and
   the inspection unit is configured to measure the resistance value between the adjacent pins in a row direction of the plurality of pins, to inspect insulation between the pins in the odd-numbered rows and the pins in the even-numbered rows.

4. The inspection device according to claim 1, further comprising:
   upper terminals arranged so as to respectively correspond to the plurality of pins and to respectively come into contact with upper ends of the plurality of pins; and
   lower terminals arranged so as to respectively correspond to the plurality of pins and to respectively come into contact with lower ends of the plurality of pins, wherein
   the first wiring includes: first wiring parts connecting the upper terminals that respectively correspond to the certain pins of the plurality of pins; and second wiring parts connecting the lower terminals that respectively correspond to the certain pins of the plurality of pins,
   the certain pins that are connected to the first wiring are arranged in series,
   the second wiring includes: third wiring parts connecting the upper terminals that respectively correspond to the remaining pins of the plurality of pins; and fourth wiring parts connecting the lower terminals that respectively correspond to the remaining pins of the plurality of pins,
   the remaining pins that are connected to the second wiring are arranged in series, and
   a first end part of the first wiring and a first end part of the second wiring are connected to the inspection unit while a second end part of the first wiring and a second end part of the second wiring are connected to a switch,
   the inspection unit confirms conduction when the switch is turned on, and the inspection unit inspects insulation between the certain pins and the remaining pins when the switch is turned off,
   it is determined that there is no contact failure when the switch is turned on and the conduction is confirmed, and it is determined that there is a contact failure when the switch is turned on and the conduction is not confirmed, and
   when it is determined that there is no contact failure, it is further determined that:
      there is no short circuit failure when the resistance value measured by the inspection unit is not less than the predetermined value, and
      there is a short circuit failure when the resistance value measured by the inspection unit is less than the predetermined value.

5. An inspection method for inspecting a short circuit failure generated at any connected part of a plurality of pins to a wiring board via solder, the plurality of pins being included in a connector provided on the wiring board, the inspection method comprising the steps of:

connecting a first wiring to certain pins of the plurality of pins and furthermore connecting a second wiring to remaining pins of the plurality of pins;

connecting an inspection unit to the first wiring and to the second wiring so as to cause the inspection unit to inspect insulation between the certain pins of the plurality of pins and the remaining pins of the plurality of pins; and measuring a resistance value between adjacent pins of the plurality of pins, wherein:

it is determined that there is no short circuit failure when the resistance value measured using the inspection unit is not less than a predetermined value, and the inspection unit confirms insulation between the certain pins and the remaining pins, and it is determined that there is a short circuit failure when the resistance value measured using the inspection unit is less than the predetermined value, and the inspection unit confirms conduction between the certain pins and the remaining pins.

6. The inspection method according to claim 5, wherein the plurality of pins is arranged in a matrix in a plan view, the step of connecting the first wiring to the certain pins of the plurality of pins and furthermore connecting the second wiring to the remaining pins of the plurality of pins further includes the steps of: connecting the first wiring to pins in odd-numbered columns out of the plurality of pins; and connecting the second wiring to pins in even-numbered columns out of the plurality of pins, and the step of inspecting insulation further includes a step of measuring the resistance value between the adjacent pins in a column direction of the plurality of pins, and the step of inspecting insulation between the pins in the odd-numbered columns and the pins in the even-numbered columns.

7. The inspection method according to claim 5, wherein the plurality of pins is arranged in a matrix in a plan view, the step of connecting the first wiring to the certain pins of the plurality of pins and furthermore connecting the second wiring to the remaining pins of the plurality of pins further includes the steps of: connecting the first wiring to pins in odd-numbered rows out of the plurality of pins; and connecting the second wiring to pins in even-numbered rows out of the plurality of pins, and the step of inspecting insulation further includes a step of measuring the resistance value between the adjacent pins in a row direction of the plurality of pins, and the step of inspecting insulation between the pins in the odd-numbered rows and the pins in the even-numbered rows.

8. The inspection method according to claim 5, wherein in the step of connecting the first wiring to the certain pins of the plurality of pins and furthermore connecting the second wiring to the remaining pins of the plurality of pins, the certain pins connected to the first wiring are arranged in series while the remaining pins connected to the second wiring are arranged in series, and the step of inspecting insulation further includes the steps of:

connecting the inspection unit to a first end part of the first wiring and to a first end part of the second wiring and furthermore connecting a switch to a second end part of the first wiring and to a second end part of the second wiring;

turning the switch on and confirming conduction by the inspection unit when the switch is turned on; and after confirming the conduction, turning the switch off and inspecting insulation, by the inspection unit, between the certain pins of the plurality of pins and the remaining pins of the plurality of pins, when the switch is turned off, and the inspection method further comprises:

determining that there is no contact failure when the switch is turned on and the conduction is confirmed;

determining that there is a contact failure when the switch is turned on and the conduction is not confirmed, and when it is determined that there is no contact failure, further determining:

there is no short circuit failure when the resistance value measured by the inspection unit is not less than the predetermined value, and there is a short circuit failure when the resistance value measured by the inspection unit is less than the predetermined value.

* * * * *